US012164842B2

United States Patent
Roper, Jr. et al.

(10) Patent No.: US 12,164,842 B2
(45) Date of Patent: *Dec. 10, 2024

(54) INTERCONNECTED DIGITAL ENGINEERING AND CERTIFICATION ECOSYSTEM

(71) Applicant: Istari Digital, Inc., Charleston, SC (US)

(72) Inventors: William Roper, Jr., Charleston, SC (US); Christopher Benson, Charleston, SC (US); Long N. Phan, Charleston, SC (US); Alethea Duhon, Orlando, FL (US); Baha Abu Nojaim, Roslindale, MA (US); Sriram Krishnan, Cambridge, MA (US)

(73) Assignee: Istari Digital, Inc., Charleston, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/375,189

(22) Filed: Sep. 29, 2023

(65) Prior Publication Data

US 2024/0135058 A1 Apr. 25, 2024
US 2024/0232464 A9 Jul. 11, 2024

Related U.S. Application Data

(63) Continuation of application No. 17/973,142, filed on Oct. 25, 2022, now Pat. No. 11,775,707.
(Continued)

(51) Int. Cl.
G06F 30/20 (2020.01)
G06F 30/12 (2020.01)
(Continued)

(52) U.S. Cl.
CPC .............. *G06F 30/20* (2020.01); *G06F 30/12* (2020.01); *G06F 30/15* (2020.01); *G06F 30/27* (2020.01); *G06F 2221/2141* (2013.01)

(58) Field of Classification Search
CPC ........................ G06F 30/20; G06F 2221/2141
See application file for complete search history.

(56) References Cited

U.S. PATENT DOCUMENTS 9,439,072 B2 9/2016 Moon et al.
9,751,625 B2 9/2017 Phan et al.
(Continued)

OTHER PUBLICATIONS

Palau CE, Fortino G, Montesinos M, Giménez P, Markarian G, Castay V, Fuart F, Pawlowski W, Mortara M, Bassi A, Gevers F. Introduction to interoperability for heterogeneous IoT platforms. Interoperability of Heterogeneous IoT Platforms: A Layered Approach. 2021:1-26. (Year: 2021).*

(Continued)

*Primary Examiner* — Chuen-Meei Gan
(74) *Attorney, Agent, or Firm* — Fish & Richardson P.C.

(57) ABSTRACT

A computer-implemented method includes receiving design and/or engineering data (D/E data) corresponding to a prototype representation of a product and transmitting one or more inputs derived from the D/E data to one or more digital engineering tools for processing. The method also includes receiving engineering-related data outputs from the one or more digital engineering tools and receiving data corresponding to one or more common validation and verification (V&V products). The method further includes identifying one or more requirements for the product based on the data corresponding to the one or more common V&V products; determining whether or not the one or more requirements have been satisfied; and presenting information corresponding to the engineering-related data outputs and/or the data corresponding to the one or more common V&V products.

(Continued)

The method also includes receiving instructions from the user device, and performing one or more manipulations of the D/E data.

35 Claims, 8 Drawing Sheets

Related U.S. Application Data

(60) Provisional application No. 63/419,051, filed on Oct. 25, 2022.

(51) Int. Cl.
    *G06F 30/15*           (2020.01)
    *G06F 30/27*           (2020.01)

(56) References Cited

U.S. PATENT DOCUMENTS

| | | |
|---|---|---|
| 9,751,626 B2 | 9/2017 | Phan et al. |
| 9,764,837 B2 | 9/2017 | Phan et al. |
| 9,902,495 B2 | 2/2018 | Phan et al. |
| 10,017,266 B2 | 7/2018 | Phan et al. |
| 10,035,596 B2 | 7/2018 | Phan et al. |
| 10,065,726 B1 | 9/2018 | Phan et al. |
| 10,198,011 B2 | 2/2019 | DeBitetto et al. |
| 10,266,262 B2 | 4/2019 | Phan et al. |
| 10,308,358 B2 | 6/2019 | Phan et al. |
| 10,400,840 B2 | 9/2019 | Davis et al. |
| 10,469,007 B2 | 11/2019 | Nayfeh et al. |
| 10,571,932 B2 | 2/2020 | DeBitetto et al. |
| 10,853,536 B1 * | 12/2020 | Steingrimsson ........ G06F 30/20 |
| 11,775,707 B1 | 10/2023 | Roper, Jr. et al. |
| 2008/0228521 A1 * | 9/2008 | Wilmering ............. G06Q 10/00 705/2 |
| 2012/0201477 A1 | 8/2012 | Jesneck et al. |
| 2013/0011078 A1 | 1/2013 | Phan et al. |
| 2014/0044340 A1 | 2/2014 | Phan et al. |
| 2014/0142881 A1 | 5/2014 | Storm |
| 2020/0226220 A1 | 7/2020 | Eck et al. |
| 2022/0067249 A1 | 3/2022 | Steingrimsson et al. |
| 2023/0028912 A1 * | 1/2023 | Steingrimsson ........ G06F 30/27 |
| 2024/0135059 A1 | 4/2024 | Roper, Jr. et al. |
| 2024/0135061 A1 | 4/2024 | Roper, Jr. et al. |
| 2024/0135063 A1 | 4/2024 | Roper, Jr. et al. |
| 2024/0135071 A1 | 4/2024 | Roper, Jr. et al. |

OTHER PUBLICATIONS

Oertel M, Josko B. Interoperable requirements engineering: tool independent specification, validation and impact analysis. InEmbedded World 2012 Exhibition and Conference 2012 (pp. 3-7). (Year: 2012).*

[No Author Listed], "Advisory Circular," U.S. Dept. of Transportation Federal Aviation Administration, Oct. 2014, 23 pages.

Ansys [online], "Ansys Systems Tool Kit (STK)," retrieved online Nov. 14, 2022, retrieved from URL <https://www.ansys.com/products/missions/ansys-stk#tab 1-2>, 4 pages.

Ansys [online], "Artificial Intelligence, Machine Learning and Deep Learning," retrieved on Nov. 14, 2022, retrieved from URL <https://www.ansys.com/technology-trends/artificial-intelligence-machine-learning-deep-learning>, 9 pages.

Benson et al., "Data-Driven Investment Decision-Making: Applying Moore's Law and S-Curves to Business Strategies," White Paper, May 2018, 32 pages.

Benson et al., "On Improvement Rates for Renewable Energy Technologies: Solar PV, Wind Turbines, Capacitors, and Batteries," Renewable Energy, Aug. 2014, 8 pages.

Benson et al., "Quantitative Determination of Technological Improvement from Patent Data," PLoS ONE, Apr. 2015, 10(4), 23 pages.

Central Drugs Standard Control Organization [online], "About CDSCO," retrieved on Nov. 14, 2022, retrieved from URL <https://cdsco.gov.in/opencms/opencms/en/Home/>, 1 page.

Code of Federal Regulations, Title 14, Part 25, "Airworthiness Standards: Transport Category Airplanes," Federal Aviation Administration, DOT, Jan. 2021, 276 pages.

Construction Products Regulation (CPR) [online], "CPR / EN 1090," retrieved on Nov. 14, 2022, retrieved from URL <https://www.eco-cert.it/en/servizi/en-1090-certification-for-steel-or-aluminium-structural-components/>, 4 pages.

Dassault Systèmes [online], "Cameo Systems Modeler," retrieved on Nov. 11, 2022, retrieved from URL <https://www.3ds.com/products-services/catia/products/no-magic/cameo-systems-modeler/>, 7 pages.

Dassault Systèmes [online], "Solidworks 3D CAD Software," retrieved on Nov. 16, 2022, retrieved from URL <https://www.solidworks.com/product/solidworks-3d-cad>, 11 pages.

Defense Acquisition University, "Defense Acquisition System: DoD 5000 Policies," retrieved on Nov. 10, 2022, retrieved from URL <https://aaf.dau.edu/aaf/policies/>, 6 pages.

Department of Defense, "Military Handbook 516C: Airworthiness Certification Criteria," Department of Defense Handbook, Dec. 12, 2014, 527 pages.

Doyle et al., "LLIMAS: Revolutionizing Integrating Modeling and Analysis at MIT Lincoln Laboratory," Optomechanical Engineering 2017, Aug. 2017, 10371(1), 11 pages.

Federal Aviation Administration, "Aeroelastic Stability Substantiation of Transport Category Airplanes," Advisory Circular, AC No. 25.629-18, Oct. 27, 2014, 23 pages.

Federal Communications Commission [online], "Equipment Authorization Procedures," retrieved on Nov. 14, 2022, retrieved from URL <https://www.fcc.gov/general/equipment-authorization-procedures-0#:~:text=A%20Declaration%20of%20Conformity%20is,with%20the%20appropriate%20technical%20standards>, 2 pages.

Ferguson, "Seven Ways in Which Artificial Intelligence Will Change Engineering Forever," Siemens, Feb. 14, 2020, 5 pages.

Flaherty et al., "Solid geometry morphing for specialized optomechanical design using LLIMAS," Optomechanics and Optical Alignment, Aug. 20121, 11816(1), 22 pages.

Fox et al., "Test and Evaluation Trends and Costs for Aircraft and Guided Weapons," Rand Project Air Force, 2004, 233 pages.

Garrick et al., "Historical development of aircraft flutter," J. Aircr., Nov. 1981, 18(11):897-912.

Goatboy29 [online], "MachUp—Free Online Aircraft Design Program," FliteTest.com, retrieved on Nov. 16, 2022, retrieved from URL <https://www.flitetest.com/articles/machup-free-online-aircraft-design-program>, May 25, 2018, 11 pages.

Goodwins, "114 Billion Transistors, One Big Meh. Apple's M1 Ultra Wake-up Call," The Register, Mar. 14, 2022, 6 pages.

GovInfo.gov [online], "Airworthiness Standards: Transport Category Airplanes," 2021, retrieved on Jul. 19, 2023, retrieved from URL<https://www.govinfo.gov/content/pkg/CFR-2021-title14-vol1/pdf/CFR-2021-title14-vol1-part25.pdf>, 276 pages.

Hart, "Introduction to Model-Based System Engineering (MBSE) and SysML," Delaware Valley INCOSE Chapter Meeting, Jul. 30, 2015, 43 pages.

IBM [online], "IBM Doors," retrieved online Nov. 16, 2022, retrieved from URL <https://www.ibm.com/products/requirements-management>, 2 pages.

International Electrotechnical Commission (IEC) [online], "About IECEE," IEC System of Conformity Assessment Schemes for Electrotechnical Equipment and Components (IECEE), retrieved online Nov. 14, 2022, retrieved from URL <https://www.iecee.org/about/what-it-is/>, 2 pages.

International Organization for Standardization, "IEC 60601-1-11:2015; Medical Electrical Equipment—Part 1-11: General Requirements for Basic Safety and Essential Performance—Collateral Standard: Requirements for Medical Electrical Equipment and Medical Electrical Systems used in the Home Healthcare Environment," Second Edition, Jan. 2015, 3 pages (abstract only).

International Organization for Standardization, "IEC 62304:2006; Medical Device Software—Software Life Cycle Processes," First Edition, May 2006, 10 pages (partial copy).

(56) References Cited

OTHER PUBLICATIONS

International Organization for Standardization, "ISO 10204:2017; Iron Ores—Determination of Magnesium—Flame Atomic Absorption Spectrometric Method," Fourth Edition, Jul. 2017, 2 pages (partial copy).

International Organization for Standardization, "ISO 10993-1:2018; Biological Evaluation of Medical Devices—Part 1: Evaluation and Testing within a Risk Management Process," Fifth Edition, Aug. 2018, 23 pages.

International Organization for Standardization, "ISO 11135:2014; Sterilization of Health-Care products—Ethylene oxide—Requirements for the Development, Validation and Routine Control of a Sterilization Process for Medical Devices," Second Edition, Jul. 2014, 13 pages (partial copy).

International Organization for Standardization, "ISO 11137-3:2017; Sterilization of Health Care Products—Radiation—Part 3: Guidance on Dosimetric Aspects of Development, Validation and Routine Control," Second Edition, Jun. 2017, 5 pages (partial copy).

International Organization for Standardization, "ISO 11607-1:2019; Packaging for Terminally Sterilized Medical Devices—Part 1: Requirements for Materials, Sterile Barrier Systems and Packaging Systems," Second Edition, Feb. 2019, 12 pages (partial copy).

International Organization for Standardization, "ISO 13485:2016; Medical devices—Quality management Systems—Requirements for Regulatory Purposes," 3rd Edition, Mar. 2016, 31 pages.

International Organization for Standardization, "ISO 14004:2016; Environmental Management Systems—General Guidelines on Implementation," Third Edition, Mar. 2016, 9 pages (partial copy).

International Organization for Standardization, "ISO 14971:2019; Medical Devices—Application of Risk Management to Medical Devices," Third Edition, Dec. 2019, 18 pages (partial copy).

International Organization for Standardization, "ISO 15223-1:2021; Medical Devices—Symbols to be used with information to be supplied by the Manufacturer—Part 1: General Requirements," Fourth Edition, Jul. 2021, 8 pages (partial copy).

International Organization for Standardization, "ISO 9001:2015; Quality Management Systems—Requirements," Fifth Edition, Sep. 2015, 6 pages (partial copy).

International Organization for Standardization, "ISO 9013:2017; Thermal Cutting—Classification of Thermal Cuts—Geometrical Product Specification and Quality Tolerances," Third Edition, Feb. 2017, 6 pages (partial copy).

International Trade Administration [online], "Certifying Your Product with CE Marking," retrieved on Nov. 14, 2022, retrieved from URL <https://www.trade.gov/ce-marking, 5 pages.

Kevan [online], "Can AI Take Simulation to a New Level?" Digital Engineering 247, retrieved on Nov. 10, 2022, retrieved from URL <https://www.digitalengineering247.com/article/can-ai-take-simulation-to-a-new-level/>, Nov. 16, 2020, 11 pages.

Leonardo R. [online], "ANSYS and NVIDIA: Closing the Gap between CAE and GAMES," Linkedin.com, retrieved on Nov. 10, 2022, retrieved from URL <https://www.linkedin.com/pulse/early-guess-breaking-boundary-between-cae-games-leonardo-rosa/>, Sep. 10, 2017, 17 pages.

Light et al., "Trends in U.S. Air Force Aircraft Mishap Rates (1950-2018)," Rand Corporation, Jan. 2020, 16 pages.

ll.mit.edu [online], "Air, Missile, And Maritime Defense Technology," 2022, retrieved on Jul. 19, 2023, retrieved from URL<https://www.ll.mit.edu/r-d/air-missile-and-maritime-defense-technology>, 10 pages.

ll.mit.edu [online], "Flight Test Facility, Lincoln Laboratory, Massachusetts Institute of Technology," 2022, retrieved on Jul. 19, 2023, retrieved from URL<https://www.ll.mit.edu/about/facilities/flight-test-facility>, 3 pages.

ll.mit.edu [online], "Lincoln Laboratory Supercomputing Center," 2022, retrieved on Jul. 19, 2023, retrieved from URL <https://www.ll.mit.edu/about/facilities/lincoln-laboratory-supercomputing-center>, 3 pages.

Mitre.org [online], "Systems Engineerings Innovation Center," retrieved on Nov. 10, 2022, retrieved from URL: <https://www.mitre.org/publications/systems-engineering-guide/se-lifecycle-building-blocks/test-and-evaluation/verification-and-validation>, 4 pages.

Mobin et al., "An approach for design Verification and Validation planning and optimization for new product reliability improvement," Reliability Engineering & System Safety, Oct. 2019, 190: 14 pages.

National Security Commission on Artificial Intelligence, "Final Report," Mar. 2021, 756 pages.

NVIDIA.Developer [online], "CUDA Toolkit," retrieved on Nov. 10, 2022, retrieved from URL <https://developer.nvidia.com/cuda-toolkit>, 8 pages.

Oertel et al., "Paper: Interoperable Requirements Engineering: Tool Independent Specification, Validation and Impact Analysis," Paper, Presented at Proceedings of the Embedded World 2012 Exhibition and Conference, Nuremberg, Germany, Feb. 28-Mar. 1, 2012, 4 pages.

OSLC [online], "Open Services for Lifecycle Collaboration," retrieved online Nov. 10, 2022, retrieved from URL <https://open-services.net/>, 11 pages.

Palau et al., "Introduction to Interoperability for Heterogeneous IOT Platforms," Springer Nature Switzerland AG, Dec. 2021, 26 pages.

PCT [online], "ThingWorx IIoT Platform," retrieved on Nov. 16, 2022, retrieved from URL <https://www.ptc.com/en/resources/iiot/product-brief/thingworx-platform>, 3 pages.

PTC [online], "Vuforia: Market-Leading Enterprise AR," retrieved on Nov. 11, 2022, retrieved from URL <https://www.ptc.com/en/products/vuforia>, 7 pages.

Roper [online], "Exclusive: AI Just Controlled a Military Plane for the First Time Ever," Popular Mechanics, retrieved Nov. 10, 2022, retrieved from URL <https://www.popularmechanics.com/military/aviation/a34978872/artificial-intelligence-controls-u2-spy-plane-air-force-exclusive/>, Dec. 16, 2020, 20 pages.

Roper, "Bending the Spoon: Guidebook for Digital Engineering," Jan. 19, 2021, 19 pages.

Roper, "There is No Spoon: The New Digital Acquisition Reality," Oct. 7, 2020, 19 pages.

Siemens [online], "TeamCenter Software," retrieved on Nov. 16, 2022, retrieved from URL <https://www.plm.automation.siemens.com/global/en/products/teamcenter/>, 18 pages.

U.S. Dept. of Commerce, "Security and Privacy Controls for Information Systems and Organizations," NIST Special Publication 800-53, Revision 5, Sep. 2020, 492 pages.

U.S. Food and Drug Administration [online], "Development & Approval Process Drugs," retrieved on Nov. 14, 2022, retrieved from URL <https://www.fda.gov/drugs/development-approval-process-drugs>, Aug. 8, 2022, 4 pages.

United States Consumer Product Safety Commission [online], "General Certificate of Conformity," retrieved on Nov. 14, 2022, retrieved from URL <https://www.cpsc.gov/Business--Manufacturing/Testing-Certification/General-Certificate-of-Conformity>, 4 pages.

Unreal Engine 5 [online], "Unreal Engine API Reference," Unreal Engine 5 Early Access Documentation, retrieved on Nov. 10, 2022, retrieved from <https://docs.unrealengine.com/5.0/en-US/API/>, 67 pages.

Voss et al., "Investigation on flutter stability of the DLR-F19/SACCON configuration," Aerospace Science and Technology, 2019, 93:105320, 11 pages.

Wikipedia [online], "Systems Modeling Language," Wikipedia reference, retrieved on Nov. 14, 2022, retrieved from URL <https://en.wikipedia.org/wiki/Systems_Modeling_Language>, 5 pages.

WSO2 [online], "WSO2 API Manager," retrieved on Nov. 14, 2022, retrieved from URL <https://wso2.com/api-manager/, 6 pages.

Aaf.dau.edu [online], "Major Capability Acquisition (MCA)," available on or before Dec. 7, 2020, retrieved on May 28, 2024, retrieved from URL<https://aaf.dau.edu/aaf/mca>, 5 pages.

Aaf.dau.edu [online], "Technical Reviews and Risk Assessments," available on or before Jan. 21, 2021, retrieved on May 28, 2024, retrieved from URL<https://aaf.dau.edu/aaf/mca/tech-reviews/>, 7 pages.

Binance.com [online], "logo Algorand (ALGO)," Jun. 21, 2019, retrieved on May 28, 2024, retrieved from URL<https://research.binance.com/en/projects/algorand>, 11 pages.

(56) References Cited

OTHER PUBLICATIONS coinbureau.com [online], "Algorand Review: Is Algo the Future of Finance?," Jan. 23, 2024, retrieved on May 28, 2024, retrieved from URL<https://www.coinbureau.com/review/algorand>, 53 pages.

Daytonaero.com [online], "Airworthiness Circular, SUAS AW Assessments," Jul. 31, 2020, retrieved on May 28, 2024, retrieved from URL<https://daytonaero.com/wp-content/uploads/AC-20-02.pdf>, 13 pages.

Daytonaero.com [online], "United States Air Force (USAF) Airworthiness Bulletin (AWB)-350," Jul. 31, 2020, retrieved on May 28, 2024, retrieved from URL<https://daytonaero.com/wp-content/uploads/AWB-350.pdf>, 5 pages.

Defense Acquisition University [online], "Technical Reviews Across the Acquisition Lifecycle," Sep. 3, 2021, retrieved on May 28, 2024, retrieved from URL<https://www.youtube.com/watch?v=hplD891ZYuE>, 147 pages.

Developer.apple.com [online], "App Sandbox," available on or before Apr. 5, 2020, retrieved on May 28, 2024, retrieved from URL<https://developer.apple.com/documentation/security/app_sandbox>, 5 pages.

Euromoney.com [online], "What is blockchain?" Feb. 29, 2020, retrieved on May 28, 2024, retrieved from URL<https://www.euromoney.com/learning/blockchain-explained/what-is-blockchain>, 2 pages.

La Rocca, "Knowledge based engineering: Between AI and CAD. Review of a language based technology to support engineering design," Advanced engineering informatics, Apr. 2012, 26(2):159-179 (Abstract Only).

Macstories.net [online], "The Initial iPhone SDK," Mar. 15, 2018, retrieved on May 28, 2024, retrieved from URL<https://www.macstories.net/stories/the-initial-iphone-sdk/>, 6 pages.

Medium.com [online], "K-Scripts: The fastest and most flexible way to articulate a user experience," Oct. 6, 2016, retrieved on May 28, 2024, retrieved from URL<https://medium.com/@bladekotelly/k-scripts-the-fastest-and-most-flexible-way-to-articulate-a-user-experience-97264d9c4786>, 15 pages.

Pergatory.mit.edu [online], "FUNdaMENTALS of Design Topic 2 Creating Ideas," Jan. 1, 2008, retrieved on May 28, 2024, retrieved from URL<https://pergatory.mit.edu/resources/FUNdaMENTALs%20Book%20pdf/FUNdaMENTALs%20Topic%202.PDF>, 75 pages.

International Search Report and Written Opinion in International Appln. No. PCT/US2023/77750, mailed on Mar. 1, 2024, 9 pages.

* cited by examiner

INTERCONNECTED DIGITAL ENGINEERING AND CERTIFICATION ECOSYSTEM

RELATED APPLICATION

The present application is a continuation of U.S. patent application Ser. No. 17/973,142, filed on Oct. 25, 2022, entitled "INTERCONNECTED DIGITAL ENGINEERING AND CERTIFICATION ECOSYSTEM," which claims priority to U.S. Provisional Patent Application Ser. No. 63/419,051, filed on Oct. 25, 2022, entitled "INTERCONNECTED DIGITAL ENGINEERING AND CERTIFICATION ECOSYSTEM," which applications are incorporated herein by reference in their entirety.

TECHNICAL FIELD

This disclosure relates to tools for digital engineering (including modeling and simulation applications) and certification of digitally engineered products.

BACKGROUND

Digital engineering tools, including modeling and simulation tools that accurately virtualize physical systems or processes for real-world decisions, enable agile development of components and/or systems. Certification of these components and/or systems still largely occurs in the physical world using physical manifestations of digitally engineered components and/or systems (sometimes referred to generally herein as "products").

SUMMARY

This document describes an interconnected digital engineering and certification ecosystem having several advantages over existing techniques for designing, engineering, testing, and certifying products.

In recent years, digital engineering tools such as modeling and simulation (M&S) tools, computer-aided design (CAD) tools, model-based systems engineering (MBSE) tools, augmented reality (AR) tools, product lifecycle management (PLM) tools, simulation engines, requirements models, electronics models, test-plan models, cost-models, schedule models, software modeling, supply-chain models, manufacturing models, cyber security models, multi-attribute tradespace tools, mission effects models, etc. have increased the agility of hardware development and manufacturing by virtualizing physical systems and/or processes for real-world decisions. However, a number of challenges remain given the current state of these digital engineering tools.

First, a large number and variety of digital engineering tools exist (often designed by different parties), which presents challenges for interoperability and can result in vendor lock-in issues. In particular, direct integration of individual digital engineering tools with one another is costly in terms of both time and money, with the number of interfaces between digital engineering tools scaling with the square of the number of distinct digital engineering tools (i.e., N 2 complexity). The large number and variety of digital engineering tools that exist can also present challenges for implementing scalable applications, automations, machine learning and/or artificial intelligence across digital engineering tools. Better interoperability between digital engineering tools can play an important role for developing, testing, and certifying products via processes that may involve a number of distinct digital engineering tools used in parallel or in sequence. Seamless interoperability between digital engineering tools can therefore be desirable for implementing such processes by enabling the development of "digital threads" or pipelines that string together the inputs and outputs of multiple digital engineering tools for particular tasks.

Second, because of the highly technical nature of many digital engineering tools, operating such tools effectively often requires a highly specialized skillset, which limits the number of individuals qualified to make use of these digital engineering tools. Moreover, individuals skilled at utilizing one digital engineering tool (e.g., a CAD tool produced by a first software company) may not be qualified to use a different kind of digital engineering tool (e.g., a MBSE tool) or even a similar digital engineering tool produced by a different company (e.g., a CAD tool produced by a second software company). This applies not only to using the tools via their custom graphical user interfaces, but also via their tool-specific or vendor-specific APIs, which can also require a highly specialized skillset.

Third, products and solutions designed using one digital engineering tool may not only be non-shareable between digital engineering tools (e.g., due to lack of interoperability), but in some cases, previously designed products and solutions may not be shareable with or searchable by others using the same digital engineering tool to solve a similar problem. For example, no repository of previously designed products, solutions, etc. may exist to share information about said products, solutions, etc. between individuals within the same team, company, technical field, etc. Moreover, even if such a repository of previously designed products and solutions does exist, it is unlikely to include information about how and why the previously designed products and solutions were arrived at, or to include simple ways to re-use the prior engineering work from the models which could potentially be used to limit duplicative efforts and/or provide useful suggestions to an individual working on a similar, but slightly different product or problem. This can result in many engineering problems needing to be redeveloped from scratch, rather than building upon the work of past efforts.

Fourth, products and solutions designed using digital engineering often require the use of many different tools that not all people will know how to use. For example, a model may be built using a particular MBSE tool, and someone who needs to access the model (or data generated from the model) may not know how to use this tool. This problem compounds with the fact that many complex systems use many different kinds of tools, meaning that in order to understand such systems, an individual may have to know how to use many different tools, which can be quite rare. This problem is compounded even further by the fact that the people who review information for certification of a product may not be familiar with some or all of the digital engineering tools, and may seek to review all of the data in a legacy format (e.g. PDF report). This poor ease-of-use between different modeling tools can cause significant delays and cost increases when developing new products, as models cannot be easily shared between different people or organizations, especially if those people or organizations have different technical skill sets.

For the reasons provided above, most digital engineering tools today are still built by people, for people in a world that increasingly operates with machine-to-machine autonomy. For example, in designing a complex system such as an aircraft, various regulatory standards may need to be adhered to, which may require a host of distinct models and simulations to assess (and consequently, the use of a host of distinct digital engineering tools). Today, such efforts require collaboration between a large number of highly specialized subject matter experts consulting a host of regulatory standard documents, necessarily involving many slow and expensive human steps in the design and engineering process. Moreover, current certification processes typically require producing physical manifestations of digitally engineered components and/or systems for evaluation in the physical world (e.g., for physical testing), which can slow down the iterative design and engineering process.

The interconnected digital engineering and certification ecosystem described herein (sometimes referred to as a "digital engineering metaverse") addresses each of these issues, and more. Among other things, the interconnected digital engineering and certification ecosystem can include a computing system (e.g., including network-connected centralized or distributed computing subsystems or components) that interfaces with various centralized or distributed digital engineering tools (e.g., via an application programming interface (API) and/or software development kit (SDK)), which can be separate from the computing system or can themselves be considered part of the computing system. The digital engineering tools can be interfaced with by an API, and/or an SDK can allow for users of the ecosystem (including digital engineering tool providers) to develop their own APIs for their tools or models to enable them to interact with the system. For example, a new company could create a new MB SE tool, then use the SDK to add their tool to the ecosystem, thus allowing it to be automatically interoperable with the rest of the tools within the ecosystem via an API. The new company could then maintain that API over time such that the manager of the overall ecosystem does not have to maintain all of the different APIs for all of the different tools. This architecture can have the advantage of increasing the ease of interoperability between digital engineering tools. For example, rather than requiring each individual digital engineering tool to be integrated with every other individual digital engineering tool in the ecosystem, the computing system can enable the interoperable use of multiple digital engineering tools implemented in multiple other computing systems (or, in some cases, within the same computing system) as long as each of the tools is integrated with the computing system. Furthermore, rather than requiring a user of the digital engineering tools to interact separately with the various digital engineering tools to perform modeling and simulations, the computing system can enable the user to interface with and utilize a single user interface of the ecosystem's computing system, which in turn, interfaces with a host of digital engineering tools. This can result in a more gradual learning curve for the user, who only has to become familiar with a single user interface (e.g., a user interface associated with the computing system) rather than several distinct user interfaces (e.g., associated with the various digital engineering tools). It can also simplify the number of interfaces between digital engineering tools from N 2 to N complexity, where N represents the number of digital engineering tools included in the ecosystem. This, in turn, can simply create scalable applications, automations, and/or machine learning and artificial intelligence across a variety of digital engineering tools.

The interconnected digital engineering and certification ecosystem also has the advantage of including digitized regulatory and certification standards, compliances, calculations, and tests (e.g., for the development, testing, and certification of products and/or solutions), which can enable users to incorporate relevant regulatory and certification standards, compliances, calculations, and test data directly into their digital engineering workflow. Regulatory and certification standards, compliances, calculations, and tests are sometimes referred to herein as "common validation and verification (V&V) products." In some implementations, the computing system of the ecosystem can interface with regulatory and/or certification authorities (e.g., via websites operated by the authorities) to retrieve digitized common V&V products published by the regulatory authorities that may be relevant for a product that a user is designing. In some implementations, the user can upload digitized common V&V products to the ecosystem themselves. The inclusion of digitized common V&V products in the ecosystem can be particularly beneficial for the completion of complex systems engineering projects, where many regulatory requirements may need to be satisfied using a number of different digital engineering tools. By connecting both digital engineering tools and digitized common V&V products, the entire product design and engineering process (or part of it) can be digitized, removing or reducing time-intensive and costly steps (e.g., human review of regulatory standards to identify regulatory requirements, human determination of what digital engineering tools are needed, human evaluation of whether the regulatory requirements are satisfied, etc.). For example, the computing system of the digital engineering and certification ecosystem can be configured to process regulatory and/or certification data corresponding to the digitized common V&V products, and engineering-related data outputs received from one or more digital engineering tools to automatically evaluate whether one or more regulatory and/or certification requirements specified in a common V&V product are satisfied. The computing system can generate a report, which can be presented to the user in an easily readable format, and can even include recommendations for improvements to a user's digital prototype of a product (e.g., to satisfy a failed regulatory and/or certification requirement). Importantly, all of this can be done without the need for any physical manifestation of the product to be manufactured, and without physical testing. As digital models and simulations continue to become more and more high-fidelity, certification of products such as unmanned aerial vehicles or other aircraft can also be performed digitally, saving time, cost, and materials associated with the physical evaluation and certification of products. Although unmanned aerial vehicles and other aircraft are mentioned as example products throughout this description, the ecosystem could be readily used to for the design, engineering, testing and/or certification of any product or solution (e.g., automobiles, drugs, medical devices, processes, etc.) that can be developed using digital engineering tools and/or that is subject to regulatory and/or certification requirements.

The interconnected digital engineering and certification ecosystem also has the advantage of providing a single computing system (which may be a centralized or distributed computing system) through which various kinds of data flow throughout the design, engineering, testing, and/or certification process. For example, data about prototypes, common V&V products, the use of digital engineering tools to satisfy particular common V&V products, the successes or failures of particular models and simulations, and various design iterations of a product can all be configured to securely flow through, and be corroborated by, the computing system of the ecosystem (e.g., using zero trust security). In some implementations, these data can be tracked and stored. This stored data can be audited for various purposes (e.g., to prevent a security breach or to perform data quality control). The stored data can also be explored to identify patterns in the data (e.g., using a machine learning engine). For example, after many uses of the digital engineering and certification ecosystem by subject matter experts, patterns in the stored data can be used to determine what digital engineering tools will be most useful for satisfying certain regulatory requirements, to suggest adjustments to inputs or parameters for effectively running models and simulations, to perform sensitivity analyses on a particular design, to design or partially design systems using machine learning and artificial intelligence, etc. This can have the advantage of making the digital engineering and certification ecosystem increasingly user-friendly for non-subject matter experts, who can be assisted by the computing system throughout the design and engineering process based on data collected from more specialized and/or experienced users, as well as accelerating the entire engineering and certification process.

The interconnected digital engineering and certification ecosystem can further have the advantage of enabling the development of a repository of previous designs and/or solutions that have already been evaluated in relation to one or more common V&V products that can be easily re-used with minimal additional engineering effort. Such designs and/or solutions can be suggested to users (e.g., both human and artificial intelligence users) for use as is, or as a starting point for modifications, thereby reducing duplicative work and streamlining the design, engineering, testing, and certification process. In some implementations, the repository can be searchable by the user to identify previous designs and/or solutions generated by others. In some implementations, the repository (or certain elements within the repository) can also be specific to users with particular credentials (e.g., users associated with a particular company, team, technical field, etc.) to avoid the disclosure of confidential materials while still promoting effective collaboration. In some cases, user credentials can additionally or alternatively be used in the interconnected digital engineering and certification ecosystem for other purposes such as moderating the kinds of digital engineering tools (or functionalities within the digital engineering tools) that a user may access. For example, the user credentials may correspond to a skill level of a user, and can be checked to ensure that a user is not overwhelmed with functionalities of a digital engineering tool that may be beyond a skill set of the user to effectively employ.

The interconnected digital engineering and certification ecosystem can further have the advantage of allowing highly valuable digital engineering models to be shared while still protecting the intellectual property contained within the models. Many modern technology development projects include multiple entities working together (e.g., a customer, a prime integrator, a supplier, etc.), requiring access to one another's models, but with different access permissions to the data. This system allows for the detailed specification of exactly which data within a model is to be shared with each individual entity, without exposing all of the data to all of the entities. This selective sharing of information allows for the measurement and tracking of which data is consumed by each entity (e.g., only sharing the inputs and outputs of a hydrodynamic pressure model) and how much data is consumed (e.g., how many runs of the hydrodynamics model are performed). This measuring and tracking allows for new business models based upon the creation of models and data that can be monitored and monetized. In some implementations, this measurement and tracking go beyond the first sharing of the data, but can also be applied to measuring and/or tracking subsequent or derivative uses of the data by third parties not engaged in the initial sharing agreement. For example, a prime contractor could share data with a first government organization, who then is free to share the data with a second government organization, and the prime contractor could have the ability to allow/disallow, track, and potentially monetize this further sharing. Such implementations can have the advantage of enabling extremely close capturing of model data.

Other features and advantages of the description will become apparent from the following description, and from the claims. Unless otherwise defined, the technical and scientific terms used herein have the same meaning as commonly understood by one of ordinary skills in the art to which this invention belongs.

General aspects of the present disclosure may include a computer-implemented method including receiving, from a user device, design and/or engineering data (D/E data) corresponding to a prototype representation of a product. The method also includes transmitting one or more inputs derived from the D/E data to one or more digital engineering tools for processing. The method also includes receiving engineering-related data outputs from the one or more digital engineering tools. The method also includes receiving data corresponding to one or more common validation and verification (V&V) products associated with the product. The method also includes identifying one or more requirements for the product based on the data corresponding to the one or more common V&V products. The method also includes determining, based on the engineering-related data outputs and the data corresponding to the one or more common V&V products, whether or not the one or more requirements have been satisfied. The method also includes presenting, at the user device, information corresponding to the engineering-related data outputs and/or the data corresponding to the one or more common V&V products. The presented information may include an indication of whether or not the one or more requirements have been satisfied, or an indication of a probability of whether or not the one or more requirements would be satisfied by the prototype representation of the product. The method also includes, subsequent to presenting the information corresponding to the engineering-related data outputs and/or the data corresponding to the one or more common V&V products at the user device, receiving instructions from the user device. In some implementations, the instructions correspond to one or more interactions of a user with the user device. The method also includes, responsive to receiving the instructions from the user device, performing one or more manipulations of the D/E data.

In some implementations, the data corresponding to the one or more common V&V products may be received from the user device. In some implementations, the data corresponding to the one or more common V&V products may be received from a regulatory and/or certification authority. In some implementations, the product may be an aircraft. In some implementations, at least a subset of the one or more digital engineering tools may include model-based systems engineering (MBSE) tools, augmented reality (AR) tools, computer aided design (CAD) tools, data analytics tools, modeling and simulation (M&S) tools, product lifecycle management (PLM) tools, simulation engines, requirements models, electronics models, test-plan models, cost-models, schedule models, software modeling, supply-chain models, manufacturing models, cyber security models, multi-attribute trade-space tools, or mission effects models. In some implementations, determining whether or not the one or more requirements have been satisfied based on the engineering-related data outputs may include determining, without any human input, whether or not the one or more requirements have been satisfied. In some implementations, the presented information may include a recommended action that the user of the user device can take to satisfy the one or more requirements. In some implementations, the recommended action may include a suggestion to use a particular digital engineering tool of the one or more digital engineering tools, a suggestion to modify the one or more inputs transmitted to the one or more digital engineering tools, a suggestion to modify one or more components of the prototype representation of the product, and/or a suggestion to replace one or more components of the prototype representation of the product with a previously designed solution. In some implementations, performing the one or more manipulations of the D/E data may include modifying the D/E data and/or deriving modified inputs from the D/E data for transmission to the one or more digital engineering tools. In some implementations, the computer-implemented method may include storing, on a storage device, usage data representing the received data corresponding to the one or more common V&V products, the received D/E data, the engineering-related data outputs from the one or more digital engineering tools, the indication of whether or not the one or more requirements have been satisfied, the indication of the probability of whether or not the one or more requirements would be satisfied by the prototype representation of the product, the one or more interactions of the user with the user device, and/or the one or more manipulations of the D/E data. In some implementations, the computer-implemented method may include incorporating at least a portion of the usage data in a training dataset. Implementations may also include training a machine learning model based on the training dataset. In some implementations, the machine learning model may be configured to receive, as input, information relating to another product being designed by another user, and to output a suggestion for the another user to use a particular digital engineering tool of the one or more digital engineering tools, a suggestion to modify one or more inputs transmitted to the one or more digital engineering tools by the another user, a suggestion to modify one or more components of another prototype representation associated with the another user, a suggestion to replace one or more components of the another prototype representation with a previously designed solution, and/or a suggestion of a wholly or partially new design generated using a machine learning engine. In some implementations, the computer-implemented method may include using the stored usage data for one or more sensitivity analyses. In some implementations, the computer-implemented method may include checking one or more credentials of the user prior to performing the one or more manipulations of the D/E data. Implementations may also include determining, based on the one or more credentials, that the user may be qualified to perform the one or more manipulations of the D/E data.

Another general aspect of the present disclosure may include a system including a memory to store instructions that may be executable, and one or more processing devices coupled to the memory, the one or more processing devices configured to execute the instructions to perform operations. The operations include receiving, from a user device, design and/or engineering data (D/E data) corresponding to a prototype representation of a product. The operations also include transmitting one or more inputs derived from the D/E data to one or more digital engineering tools for processing. The operations also include receiving engineering-related data outputs from the one or more digital engineering tools. The operations also include receiving data corresponding to one or more common validation and verification (V&V) products associated with the product. The operations also include identifying one or more requirements for the product based on the data corresponding to the one or more common V&V products. The operations also include determining, based on the engineering-related data outputs and the data corresponding to the one or more common V&V products, whether or not the one or more requirements have been satisfied. The operations also include presenting, at the user device, information corresponding to the engineering-related data outputs and/or the data corresponding to the one or more common V&V products. The presented information may include an indication of whether or not the one or more requirements have been satisfied, or an indication of a probability of whether or not the one or more requirements would be satisfied by the prototype representation of the product. The operations also include subsequent to presenting the information corresponding to the engineering-related data outputs and/or the data corresponding to the one or more common V&V products at the user device, receiving instructions from the user device. In some implementations, the instructions correspond to one or more interactions of a user with the user device. The operations also include responsive to receiving the instructions from the user device, performing one or more manipulations of the D/E data.

In some implementations, the data corresponding to the one or more common V&V products may be received from the user device. In some implementations, the data corresponding to the one or more common V&V products may be received from a regulatory and/or certification authority. In some implementations, the product may be an aircraft. In some implementations, at least a subset of the one or more digital engineering tools may include model-based systems engineering (MBSE) tools, augmented reality (AR) tools, computer aided design (CAD) tools, data analytics tools, modeling and simulation (M&S) tools, product lifecycle management (PLM) tools, simulation engines, requirements models, electronics models, test-plan models, cost-models, schedule models, software modeling, supply-chain models, manufacturing models, cyber security models, multi-attribute trade-space tools, or mission effects models. In some implementations, determining whether or not the one or more requirements have been satisfied based on the engineering-related data outputs may include determining, without any human input, whether or not the one or more requirements have been satisfied. In some implementations, the presented information may include a recommended action that the user of the user device can take to satisfy the one or more requirements. In some implementations, the recommended action may include a suggestion to use a particular digital engineering tool of the one or more digital engineering tools, a suggestion to modify the one or more inputs transmitted to the one or more digital engineering tools, a suggestion to modify one or more components of the prototype representation of the product, and/or a suggestion to replace one or more components of the prototype representation of the product with a previously designed solution. In some implementations, performing the one or more manipulations of the D/E data may include modifying the D/E data and/or deriving modified inputs from the D/E data for transmission to the one or more digital engineering tools. In some implementations, the operations may include storing, on a storage device, usage data representing the received data corresponding to the one or more common V&V products, the received D/E data, the engineering-related data outputs from the one or more digital engineering tools, the indication of whether or not the one or more requirements have been satisfied, the indication of the probability of whether or not the one or more requirements would be satisfied by the prototype representation of the product, the one or more interactions of the user with the user device, and/or the one or more manipulations of the D/E data. In some implementations, the operations may include incorporating at least a portion of the usage data in a training dataset. In some implementations, the operations may also include training a machine learning model based on the training dataset. In some implementations, the machine learning model may be configured to receive, as input, information relating to another product being designed by another user, and to output a suggestion for the another user to use a particular digital engineering tool of the one or more digital engineering tools, a suggestion to modify one or more inputs transmitted to the one or more digital engineering tools by the another user, a suggestion to modify one or more components of another prototype representation associated with the another user, a suggestion to replace one or more components of the another prototype representation with a previously designed solution, and/or a suggestion of a wholly or partially new design generated using a machine learning engine. In some implementations, the operations may include using the stored usage data for one or more sensitivity analyses. In some implementations, the operations may include checking one or more credentials of the user prior to performing the one or more manipulations of the D/E data. In some implementations, the operations may also include determining, based on the one or more credentials, that the user may be qualified to perform the one or more manipulations of the D/E data.

Another general aspect of the present disclosure may include one or more non-transitory machine-readable storage media storing instructions that are executed to perform operations. The operations include receiving, from a user device, design and/or engineering data (D/E data) corresponding to a prototype representation of a product. The operations also include transmitting one or more inputs derived from the D/E data to one or more digital engineering tools for processing. The operations also include receiving engineering-related data outputs from the one or more digital engineering tools. The operations also include receiving data corresponding to one or more common validation and verification (V&V) products associated with the product. The operations also include identifying one or more requirements for the product based on the data corresponding to the one or more common V&V products. The operations also include determining, based on the engineering-related data outputs and the data corresponding to the one or more common V&V products, whether or not the one or more requirements have been satisfied. The operations also include presenting, at the user device, information corresponding to the engineering-related data outputs and/or the data corresponding to the one or more common V&V products. The presented information may include an indication of whether or not the one or more requirements have been satisfied, or an indication of a probability of whether or not the one or more requirements would be satisfied by the prototype representation of the product. The operations also include subsequent to presenting the information corresponding to the engineering-related data outputs and/or the data corresponding to the one or more common V&V products at the user device, receiving instructions from the user device. In some implementations, the instructions correspond to one or more interactions of a user with the user device. The operations also include responsive to receiving the instructions from the user device, performing one or more manipulations of the D/E data.

In some implementations, the data corresponding to the one or more common V&V products may be received from the user device. In some implementations, the data corresponding to the one or more common V&V products may be received from a regulatory and/or certification authority. In some implementations, the product may be an aircraft. In some implementations, at least a subset of the one or more digital engineering tools may include model-based systems engineering (MBSE) tools, augmented reality (AR) tools, computer aided design (CAD) tools, data analytics tools, modeling and simulation (M&S) tools, product lifecycle management (PLM) tools, simulation engines, requirements models, electronics models, test-plan models, cost-models, schedule models, software modeling, supply-chain models, manufacturing models, cyber security models, multi-attribute trade-space tools, or mission effects models. In some implementations, determining whether or not the one or more requirements have been satisfied based on the engineering-related data outputs may include determining, without any human input, whether or not the one or more requirements have been satisfied. In some implementations, the presented information may include a recommended action that the user of the user device can take to satisfy the one or more requirements. In some implementations, the recommended action may include a suggestion to use a particular digital engineering tool of the one or more digital engineering tools, a suggestion to modify the one or more inputs transmitted to the one or more digital engineering tools, a suggestion to modify one or more components of the prototype representation of the product, and/or a suggestion to replace one or more components of the prototype representation of the product with a previously designed solution. In some implementations, performing the one or more manipulations of the D/E data may include modifying the D/E data and/or deriving modified inputs from the D/E data for transmission to the one or more digital engineering tools. In some implementations, the operations may include storing, on a storage device, usage data representing the received data corresponding to the one or more common V&V products, the received D/E data, the engineering-related data outputs from the one or more digital engineering tools, the indication of whether or not the one or more requirements have been satisfied, the indication of the probability of whether or not the one or more requirements would be satisfied by the prototype representation of the product, the one or more interactions of the user with the user device, and/or the one or more manipulations of the D/E data. In some implementations, the operations may include incorporating at least a portion of the usage data in a training dataset. In some implementations, the operations may also include training a machine learning model based on the training dataset. In some implementations, the machine learning model may be configured to receive, as input, information relating to another product being designed by another user, and to output a suggestion for the another user to use a particular digital engineering tool of the one or more digital engineering tools, a suggestion to modify one or more inputs transmitted to the one or more digital engineering tools by the another user, a suggestion to modify one or more components of another prototype representation associated with the another user, a suggestion to replace one or more components of the another prototype representation with a previously designed solution, and/or a suggestion of a wholly or partially new design generated using a machine learning engine. In some implementations, the operations may include using the stored usage data for one or more sensitivity analyses. In some implementations, the operations may include checking one or more credentials of the user prior to performing the one or more manipulations of the D/E data. In some implementations, the operations may also include determining, based on the one or more credentials, that the user may be qualified to perform the one or more manipulations of the D/E data.

DETAILED DESCRIPTION

This disclosure describes an interconnected digital engineering and certification ecosystem that can enable new capabilities and improve the process for digital product development, including the digital design, digital engineering, digital testing, and digital certification of products. For the purposes of this disclosure the terms "design" and "engineer" are used largely synonymously and are broadly defined to encapsulate the process of intelligently developing a product to solve a particular problem (e.g., to improve performance, increase aesthetic appeal, satisfy one or more regulatory requirements, etc.).

Figure 1:
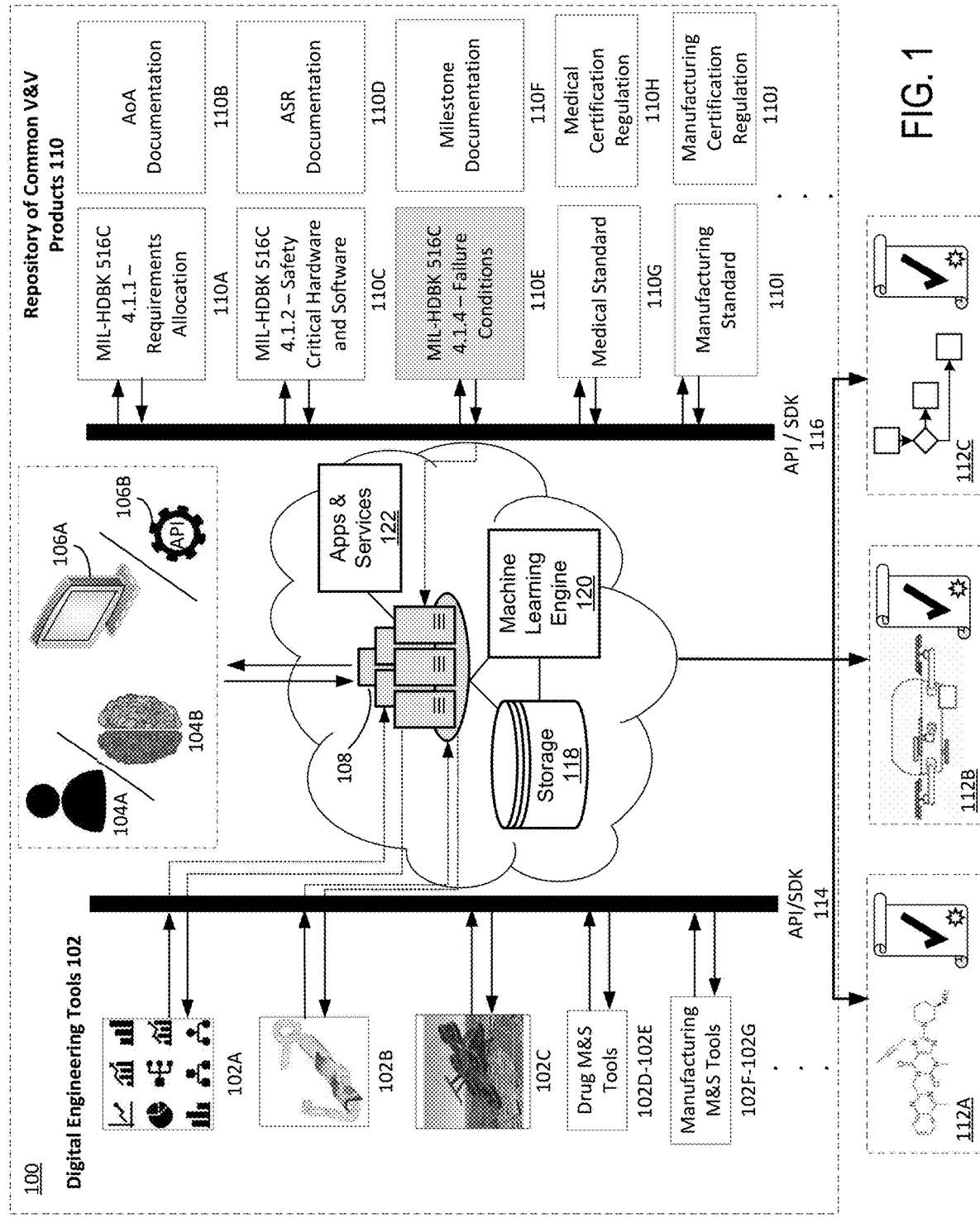
FIG. 1 is a diagram showing an example interconnected digital engineering and certification ecosystem, and digitally certified products.

FIG. 1 shows an example interconnected digital engineering and certification ecosystem 100 and examples of digitally certified products 112A-112C (collectively referred to as digitally certified products 112). For example, in some implementations, the digitally certified product 112A can be an unmanned aerial vehicle [UAV] or other aircraft, the digitally certified product 112B can be a drug or other chemical or biologic compound, and the digitally certified product 112C can be a process such as a manufacturing process. In general, the digitally certified products 112 can include any product, process, or solution that can be developed, tested, or certified (partially or entirely) using digital engineering tools (e.g., the digital engineering tools 102). In some implementations, the digitally certified products 112 may not be limited to physical products, but can include non-physical products as well (e.g., processes, software, etc.). While physical and physically-interacting systems often require multiple digital engineering tools to assess for compliance with common V&V products simply by virtue of the need for M&S, many complex non-physical systems may also require multiple digital engineering tools for product development, testing, and/or certification. With this in mind, various other possibilities for digitally certified products will be recognized by one of ordinary skill in the art.

The digitally certified products 112 can be designed and/or certified using the interconnected digital engineering and certification ecosystem 100. The interconnected digital engineering and certification ecosystem 100 can include a user device 106A or API (or other similar machine-to-machine communication interface) 106B operated by a user (e.g., human users 104A of various skill levels, or artificial users 104B such as algorithms, artificial intelligence, or other software), and a computing system 108 connected to (and/or including) a data storage unit 118, a machine learning engine 120, and an application and service layer 122. For the purposes of clarity, any user selected from the various potential human users 104A or artificial users 104B are referred to herein simply as the user 104. In some implementations, the computing system 108 can be a centralized computing system, while in other implementations, the computing system 108 can be a distributed computing system. In some cases, the user 104 can be considered part of the ecosystem 100, while in other implementations, the user 104 can be considered separate from the ecosystem 100. The ecosystem 100 also includes one or more digital engineering tools 102 (e.g., data analysis tool 102A, CAD and finite element analysis tool 102B, simulation tool 102C, drug M&S tools 102D-102E, manufacturing M&S tools 102F-102G, etc.) and a repository of common V&V products 110 (e.g., regulatory standards 110A-110F related to the development and certification of a UAV, medical standard 110G (e.g., CE marking (Europe), FCC Declaration of Conformity (USA), IECEE CB Scheme (Europe, North America, parts of Asia & Australia), CDSCO (India), FDA (USA), etc.), medical certification regulation 110H (e.g., ISO 13485, ISO 14971, ISO 9001, ISO 62304, ISO 10993, ISO 15223, ISO 11135, ISO 11137, ISO 11607, IEC 60601, etc.), manufacturing standard 110I (e.g., ISO 9001, ISO 9013, ISO 10204, EN 1090, ISO 14004, etc.), manufacturing certification regulation 110J (e.g., General Certification of Conformity (GCC), etc.), etc.).

The computing system 108 of the ecosystem 100 is centrally disposed within the architecture of the ecosystem 100 and is configured to communicate with (e.g., receive data from and transmit data to) the user device 106A or the API 106B (e.g., an API associated with an artificial user 104B), the digital engineering tools 102 (e.g., via an application programming interface [API]/software development kit [SDK] 114), and the repository of common V&V products 110 (e.g., via the API/SDK 116). For example, the computing system 108 can be configured to communicate with the user device 106A and/or the API 106B to send or receive data corresponding to a prototype of a design, information about a user (e.g., user credentials), engineering-related inputs/outputs associated with the digital engineering tools 102, digitized common V&V products, an evaluation of a product design, user instructions (e.g., search requests, data processing instructions, etc.), and more. The computing system 108 can also be configured to communicate with one or more digital engineering tools 102 to send engineering-related inputs for executing analyses, models, simulations, tests, etc. and to receive engineering-related outputs associated with the results. The computing system 108 can also be configured to communicate with the repository of common V&V products 110 to retrieve data corresponding to one or more digitized common V&V products 110 and/or upload new common V&V products (e.g., those received from the user 104) to the repository of common V&V products 110. All communications can be transmitted and corroborated securely, for example, using methods relying on zero trust security.

The computing system 108 can process and/or store the data that it receives, and in some implementations (e.g., using the storage 118), can access a machine learning engine 120 and/or an application and service layer 122 (either included as part of the computing system 108 or external to it), to identify useful insights based on the data, as further described herein. The central disposition of the computing system 108 within the architecture of the ecosystem 100 has many advantages including reducing the technical complexity of integrating the various digital engineering tools 102; improving the product development experience of the user 104; intelligently connecting common V&V products (e.g., standards 110A-110F) to the digital engineering tools 102 most useful for satisfying requirements associated with the common V&V products; and enabling the monitoring, storing, and analysis of the various data that flows between the elements of the ecosystem 100 throughout the product development process. In some implementations, the data flowing through (and potentially stored by) the computing system 108 can also be auditable to prevent a security breach, to perform data quality control, etc.

Referring to one particular example shown in FIG. 1, the user 104 can use the digital engineering and certification ecosystem 100 to produce a digitally certified UAV 112B. For example, the user 104 may be primarily concerned with certifying the UAV as satisfying the requirements of a particular regulatory standard 110E relating to failure conditions of the UAV (e.g., "MIL-HDBK 516C 4.1.4—Failure Conditions"). In this usage scenario, the user 104 can develop a digital prototype of the UAV on the user device 106A or using the API 106B and can transmit the prototype data (e.g., as at least one of a CAD file, a MB SE file, etc.) to the computing system 108. Along with the prototype data, the user 104 can transmit, via the user device 106A, additional data including an indication of the common V&V product that the user 104 is interested in certifying the product for (e.g., regulatory standard 110E), user credential information for accessing one or more capabilities of the computing system 108, and/or instructions for running one or more digital models, tests, and/or simulations using a subset of the digital engineering tools 102.

Referring to another example shown in FIG. 1, the user 104 can use the digital engineering and certification ecosystem 100 to produce a digitally certified drug, chemical compound, or biologic 112A. For example, the user 104 may be primarily concerned with certifying the drug, chemical compound, or biologic 112A as satisfying the requirements of a particular medical standard 110G and medical certification regulation 110H. In this usage scenario, the user 104 can develop a digital prototype of the drug, chemical compound, or biologic on the user device 106A or using the API 106B and can transmit the prototype data (e.g., as a molecular modeling file) to the computing system 108. Along with the prototype data, the user 104 can transmit, via the user device 106A, additional data including an indication of the common V&V products that the user 104 is interested in certifying the product for (e.g., medical standard 110G and medical certification regulation 110H), user credential information for accessing one or more capabilities of the computing system 108, and/or instructions for running one or more digital models, tests, and/or simulations using a subset of the digital engineering tools 102 (e.g., drug M&S tools 102D-102E).

Referring to yet another example shown in FIG. 1, the user 104 can use the digital engineering and certification ecosystem 100 to produce a digitally certified manufacturing process 112C. For example, the user 104 may be primarily concerned with certifying the manufacturing process 112C as satisfying the requirements of a particular manufacturing standard 110I and manufacturing certification regulation 110J. In this usage scenario, the user 104 can develop a digital prototype of the manufacturing process on the user device 106A or using the API 106B and can transmit the prototype data to the computing system 108. Along with the prototype data, the user 104 can transmit, via the user device 106A, additional data including an indication of the common V&V products that the user 104 is interested in certifying the process for (e.g., manufacturing standard 110I and manufacturing certification regulation 110J), user credential information for accessing one or more capabilities of the computing system 108, and/or instructions for running one or more digital models, tests, and/or simulations using a subset of the digital engineering tools 102 (e.g., manufacturing M&S tools 102F-102G).

In any of the above examples, the computing system 108 can receive the data transmitted from the user device 106A and/or the API 106B and can process the data to evaluate whether the common V&V product of interest (e.g., regulatory standard 110E, medical standard 110G, medical certification regulation 110H, manufacturing standard 110I, manufacturing certification regulation 110J, etc.) is satisfied by the user's digital prototype. For example, this can involve communicating with the repository of common V&V products 110 (via the API/SDK 116) to retrieve the relevant common V&V product of interest and processing the regulatory and/or certification data associated with the common V&V product to identify one or more requirements for the UAV prototype; the drug, chemical compound, or biologic prototype; the manufacturing process prototype; etc. In some implementations, the repository of common V&V products 110 can be hosted by a regulatory and/or certification authority (or another third party), and retrieving the regulatory and/or certification data can involve using the API/SDK 116 to interface with one or more data resources maintained by the regulatory and/or certification authority (or the another third party). In some implementations, the regulatory and/or certification data can be provided directly by the user 104 via the user device 106A and/or the API 106B (e.g., along with the prototype data).

Evaluating whether the common V&V product of interest (e.g., regulatory standard 110E, medical standard 110G, medical certification regulation 110H, manufacturing standard 110I, manufacturing certification regulation 110J, etc.) is satisfied by the user's digital prototype can also involve processing the prototype data received from the user device 106A or the API 106B to determine if the one or more identified requirements are actually satisfied. In some implementations, the computing system 108 can include one or more plugins, local applications, etc. to process the prototype data directly at the computing system 108. In some implementations, the computing system can simply preprocess the received prototype data (e.g., to derive inputs for the digital engineering tools 102) and can then transmit instructions and/or input data to a subset of the digital engineering tools 102 via the API/SDK 114 for further processing.

Not all digital engineering tools 102 are necessarily required for the satisfaction of particular regulatory and/or certification standards. Therefore, in the UAV example provided in FIG. 1, the computing system 108 may determine that only a data analysis tool 102A and a finite element analysis tool 102B are required to satisfy the regulatory standard 110E for failure conditions. In the drug, chemical compound, or biologic example provided in FIG. 1, the computing system 108 may determine that only drug M&S tools 102D-102E are required to satisfy the medical standard 110G and medical certification regulation 110H. In the manufacturing process example provided in FIG. 1, the computing system 108 may determine that only manufacturing M&S tools 102F-102G are required to satisfy the manufacturing standard 110I and manufacturing certification regulation 110J. In other implementations, the user 104 may themselves identify the particular subset of the digital engineering tools 102B that should be used to satisfy the common V&V product of interest, provided that the user 104 is a qualified subject matter expert. In other implementations, the user 104 may input to the computing system 108 some suggested digital engineering tools 102 to satisfy a common V&V product of interest, and the computing system 108 can recommend to the user 104 a modified subset of the digital engineering tools 102 for final approval by the user 104, provided that the user 104 is a qualified subject matter expert. After a subset of the digital engineering tools 102 has been identified, the computing system 108 can then transmit instructions and/or input data to the identified subset of the digital engineering tools 102 to run one or more models, tests, and/or simulations. The results (or "engineering-related data outputs") of these models, tests, and/or simulations can be transmitted back and received at the computing system 108.

In still other implementations, the user 104 may input a required digital engineering tool (e.g., digital engineering tool 102F) for meeting a common V&V product 110I, and the computing system 108 can determine that another digital engineering tool (e.g., digital engineering tool 102G) is also required to satisfy the common V&V product 110I. The computing system can then transmit instructions and/or input data to both digital engineering tools (e.g., digital engineering tools 102F and 102G), and the outputs of these digital engineering tools can be transmitted and received at the computing system 108. In some cases, the input data submitted to one of the digital engineering tools (e.g., digital engineering tool 102G) can be derived (e.g., by the computing system 108) from the output of another of the digital engineering tools (e.g., digital engineering tool 102F).

After receiving engineering-related data outputs from the digital engineering tools 102, the computing system 108 can then process the received engineering-related data outputs to evaluate whether or not the requirements identified in the common V&V product of interest (e.g., regulatory standard 110E, medical standard 110G, medical certification regulation 110H, manufacturing standard 110I, manufacturing certification regulation 110J, etc.) are satisfied. In some implementations, the computing system 108 can generate a report summarizing the results of the evaluation and can transmit the report to the user device 106A or the API 106B for review by the user 104. If all of the requirements are satisfied, then the prototype can be certified, resulting in the digitally certified product 112 (e.g., the digitally certified drug, chemical compound, or biologic 112A; the digitally certified UAV 112B; the digitally certified manufacturing process 112C, etc.). However, if some of the regulatory requirements are not satisfied, then additional steps may need to be taken by the user 104 to certify the prototype of the product. In some implementations, the report that is transmitted to the user can include recommendations for these additional steps (e.g., suggesting one or more design changes, suggesting the replacement of one or more components with a previously designed solution, suggesting one or more adjustments to the inputs of the models, tests, and/or simulations, etc.). If the requirements of a common V&V product are partially met, or are beyond the collective capabilities of the distributed engineering tools 102, the computing systems 108 may provide the user 104 with a report recommending partial certification, compliance, or fulfillment of a subset of the common V&V products (e.g., digital certification of a subsystem or a sub-process of the prototype). The process of generating recommendations for the user 104 is described in further detail below.

In response to reviewing the report, the user 104 can make design changes to the digital prototype locally and/or can send one or more instructions to the computing system 108 via the user device 106A or the API 106B. These instructions can include, for example, instructions for the computing system 108 to re-evaluate an updated prototype design, use one or more different digital engineering tools 102 for the evaluation process, and/or modify the inputs to the digital engineering tools 102. The computing system 108 can, in turn, receive the user instructions, perform one or more additional data manipulations in accordance with these instructions, and provide the user 104 with an updated report. Through this iterative process, the user 104 can utilize the interconnected digital engineering and certification ecosystem 100 to design and ultimately certify (e.g., by providing certification compliance information) the prototype (e.g., the UAV prototype, drug prototype, manufacturing process prototype, etc.) with respect to the common V&V product of interest. Importantly, since all of these steps occur in the digital world (e.g., with digital prototypes, digital models/tests/simulations, and digital certification), significant amount of time, cost, and materials can be saved in comparison to a process that would involve the physical prototyping, evaluation and/or certification of a similar UAV, drug, manufacturing process, etc. If the requirements associated with a common V&V product are partially met, or are beyond the collective capabilities of the digital engineering tools 102, the computing system 108 may provide the user 104 with a report recommending partial certification, compliance or fulfillment of a subset of the common V&V products (e.g., digital certification of a subsystem or a sub-process of the prototype).

While the examples described above focus on the use of the interconnected digital engineering and certification ecosystem 100 by a single user, additional advantages of the ecosystem 100 can be realized through the repeated use of the ecosystem 100 by multiple users. As mentioned above, the central positioning of the computing system 108 within the architecture of the ecosystem 100 enables the computing system 108 to monitor and store the various data flows through the ecosystem 100. Thus, as an increasing number of users utilize the ecosystem 100 for digital product development, data associated with each use of the ecosystem 100 can be stored (e.g., in the storage 118) and analyzed to yield various insights, which can be used to further automate the digital product development process and to make the digital product development process easier to navigate for non-subject matter experts.

Indeed, in some implementations, user credentials for the user 104 can be indicative of the skill level of the user 104, and can control the amount of automated assistance the user is provided. For example, non-subject matter experts may only be allowed to utilize the ecosystem 100 to browse pre-made designs and/or solutions, to use the digital engineering tools 102 with certain default parameters, and/or to follow a pre-determined workflow with automated assistance directing the user 104 through the product development process. Meanwhile more skilled users may still be provided with automated assistance, but may be provided with more opportunities to override default or suggested workflows and settings.

In some implementations, the computing system 108 can host applications and services 122 that automate or partially automate components of common V&V products; expected or common data transmissions, including components of data transmissions, from the user 104; expected or common interfaces and/or data exchanges, including components of interfaces, between various digital engineering tools 102; expected or common interfaces and/or data exchanges, including components of interfaces, with machine learning models implemented on the computing system 108 (e.g., models trained and/or implemented by the machine learning engine 120); and expected or common interfaces and/or data exchanges between the applications and services themselves (e.g., within the applications and services layer 122).

In some implementations, the data from multiple uses of the ecosystem 100 (or a portion of said data) can be aggregated to develop a training dataset. This training dataset can then be used to train machine learning models (e.g., using the machine learning engine 120) to perform a variety of tasks including the identification of which of the digital engineering tools 102 to use to satisfy a particular common V&V product; the identification of specific models, tests, and/or simulations (including inputs to them) that should be performed using the digital engineering tools 102; the identification of the common V&V products that need to be considered for a product of a particular type; the identification of one or more recommended actions for the user 104 to take in response to a failed regulatory requirement; the estimation of model/test/simulation sensitivity to particular inputs; etc. The outputs of the trained machine learning models can be used to implement various features of the interconnected digital engineering and certification ecosystem 100 including automatically suggesting inputs (e.g., inputs to the digital engineering tools 102) based on previously entered inputs, forecasting time and cost requirements for developing a product, predictively estimating the results of sensitivity analyses, and even suggesting design changes, original designs or design alternatives (e.g. via assistive or generative AI) to a user's prototype to overcome one or more requirements (e.g., regulatory and/or certification requirements) associated with a common V&V product. In some implementations, with enough training data, the machine learning engine 120 may generate new designs, models, simulations, tests, and/or common V&V products on its own based on data collected from multiple uses of the ecosystem 100.

In addition to storing usage data to enable the development of machine learning models, previous prototype designs and/or solutions (e.g., previously designed components, systems, models, simulations and/or other engineering representations thereof) can be stored within the ecosystem 100 (e.g., in storage 118) to enable users to search for and build upon the work of others. For example, previously designed components, systems, models, simulations and/or other engineering representations thereof can be searched for by the user 104 and/or suggested to the user 104 by the computing system 108 in order to satisfy one or more requirements associated with a common V&V product. The previously designed components, systems, models, simulations and/or other engineering representations thereof can be utilized by the user 104 as is, or can be utilized as a starting point for additional modifications. This store, or repository, of previously designed components, systems, models, simulations and/or other engineering representations thereof (whether or not they were ultimately certified) can be monetized to create a marketplace of digital products, which can be utilized to save time during the digital product development process, inspire users with alternative design ideas, avoid duplicative efforts, and more. In some implementations, data corresponding to previous designs and/or solutions may only be stored if the user who developed the design and/or solution opts to share the data. In some implementations, the repository of previous designs and/or solutions can be containerized for private usage within a single company, team, organizational entity, or technical field for private usage (e.g., to avoid the unwanted disclosure of confidential information). In some implementations, user credentials associated with the user 104 can be checked by the computing system 108 to determine which designs and/or solutions stored in the repository can be accessed by the user 104. In some implementations, usage of the previously designed components, systems, models, simulations and/or other engineering representations thereof may be available only to other users who pay a fee for a usage.

Figure 2A:
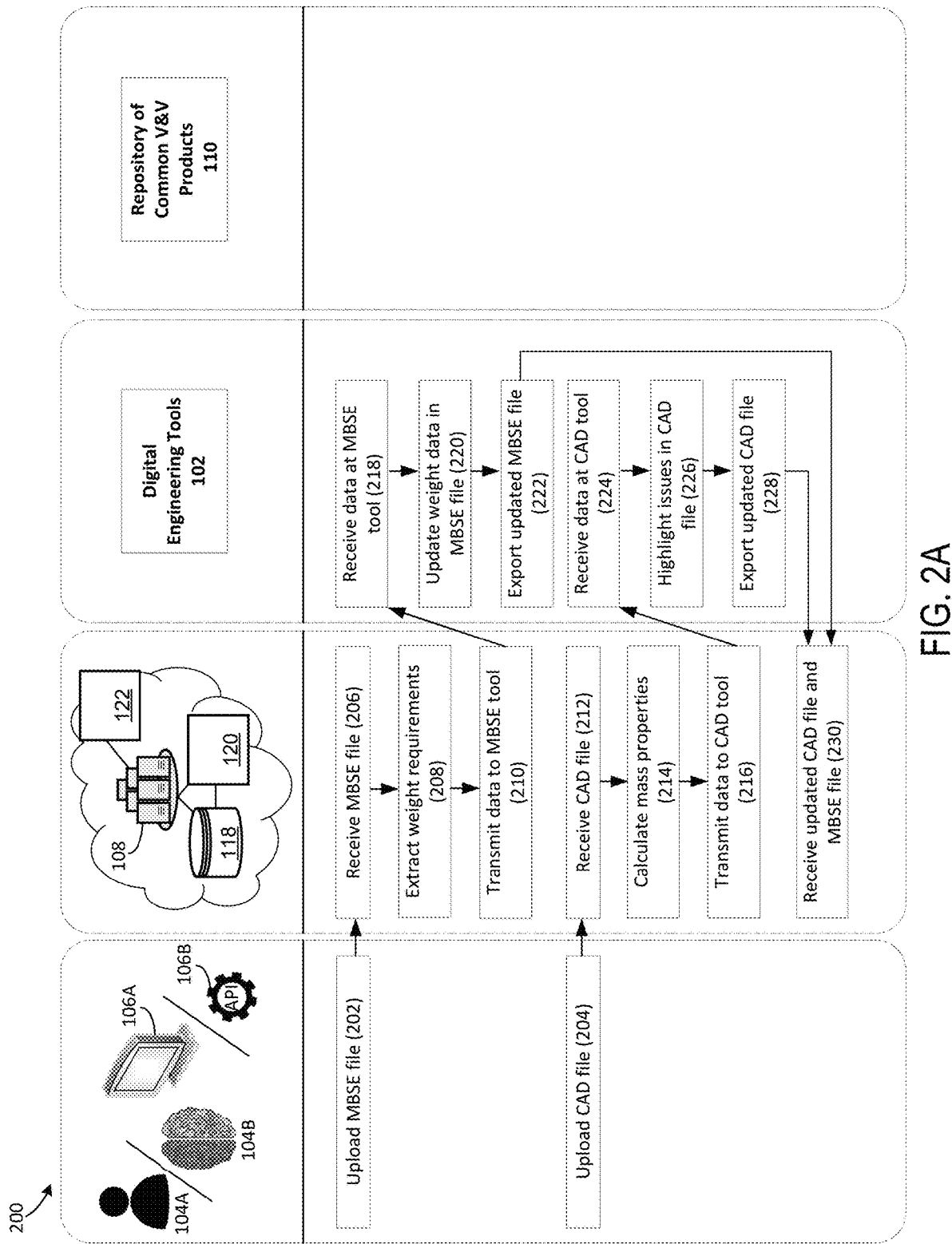
FIGS. 2A-2B are flow charts showing an example workflow involving an interconnected digital engineering and certification ecosystem.
Figure 2B:
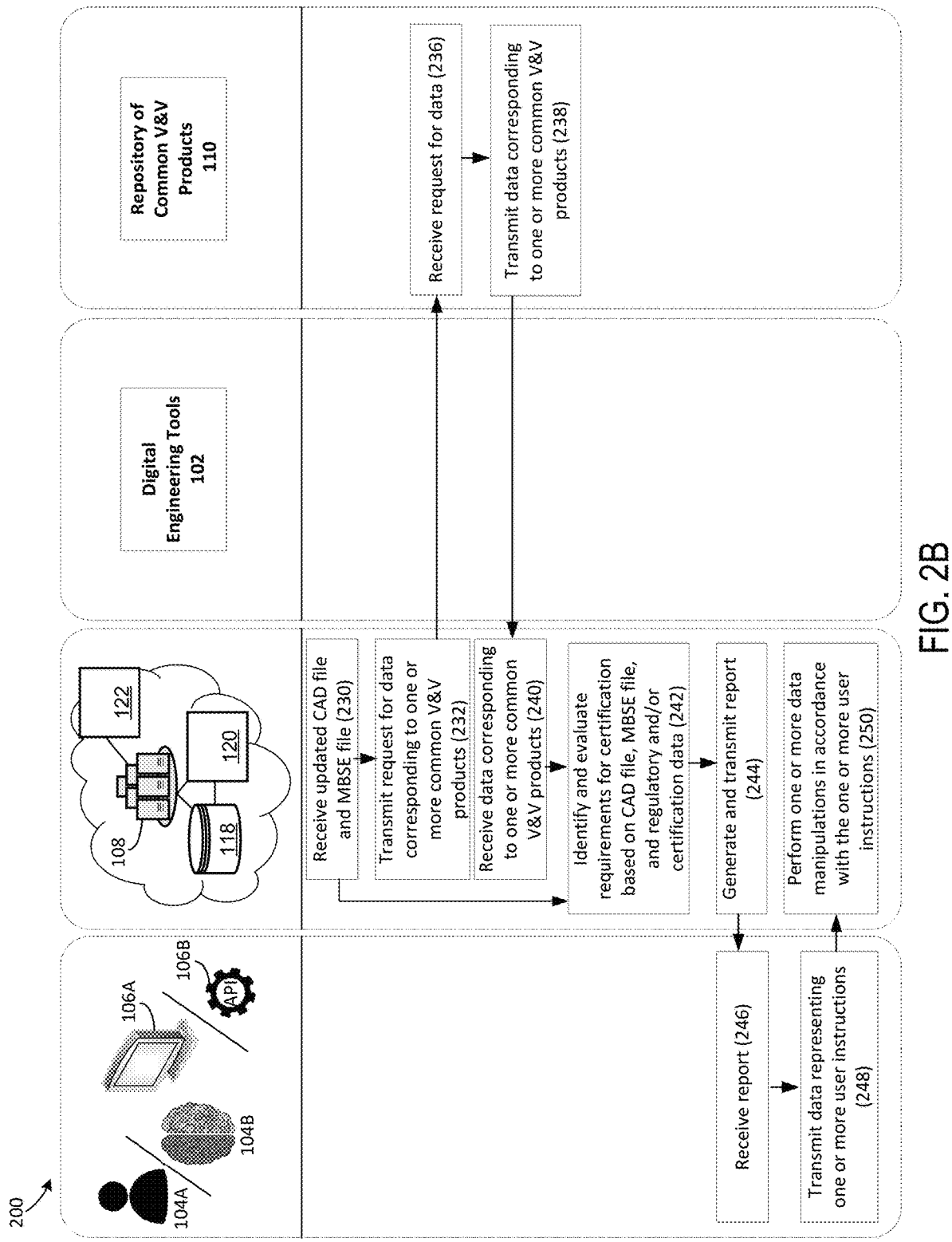

Referring now to FIGS. 2A-2B, an example digital product development and certification workflow 200 is shown, which can be implemented using the integrated digital engineering and certification ecosystem 100 (shown in FIG. 1). While not intended to be limiting, the workflow 200 is used to describe a demonstrative and practical example illustrative of the kinds of workflows enabled by the ecosystem 100 and its various features. In FIGS. 2A-2B, individual steps of the workflow 200 are grouped by the elements of the ecosystem 100 that perform them (i.e., the user device 106A or the API 106B operated by the user 104; the computing system 108 connected to (and/or including) the storage 118, the machine learning engine 120, and the applications and services layer 122; the digital engineering tools 102; and the repository of common V&V products 110).

At step 202, the user 104 can upload a MBSE file corresponding to a digital representation of a product (e.g., a UAV) from the user device 106A or the API 106B to the computing system 108. At step 204, the user 104 can also upload a CAD file corresponding to the digital representation of the product from the user device 106 to the computing system 108.

The computing system 108 can receive the MBSE file (206), process the MB SE file to extract weight requirements (208), and transmit data to a MB SE tool (210). For example, the data transmitted to the MB SE tool can include updated weight data, which the computing system 108 can request the MBSE tool to update the MBSE file with. The request can be made, for example, via the API 114 shown in FIG. 1.

Likewise, the computing system 108 can receive the CAD file (212), process the CAD file to calculate, e.g., mass properties (214) of the digital prototype, and can transmit data to a CAD tool (216). For example, the data transmitted to the CAD tool can include identified weight issues, which the computing system 108 can request the CAD tool to update the CAD file with (e.g., by highlighting the identified issues in the CAD file). This request can also be made via the API/SDK 114 shown in FIG. 1.

At step 218, the MB SE tool (e.g., one of the digital engineering tools 102) can receive the data transmitted to the MBSE tool from the computing system 108. The MB SE tool can then update the weight data in the MBSE file (220) and export the updated MB SE file (222) to the computing system 108.

Likewise, at step 224, the CAD tool (e.g., another one of the digital engineering tools 102) can receive the data transmitted to the CAD tool from the computing system 108. The CAD tool can then update the CAD file to highlight issues in the CAD file (226) and export the updated CAD file (228) to the computing system 108.

At step 230, the computing system 108 can receive the updated CAD file and MBSE file exported by the CAD tool and the MB SE tool, respectively.

At step 232, the computing system 108 can transmit a request for data (e.g., regulatory and/or certification data) corresponding to one or more common V&V products (232). For example, the request can be transmitted via the API/SDK 116 shown in FIG. 1 to be processed at the repository of common V&V products 110, which, as described previously, can be hosted by a regulatory and/or certification authority or another third party. While the step 232 is shown subsequent to the communication of the computing system 108 with the digital engineering tools 102 in the workflow 200 (e.g., steps 210, 216, 222, 228, 230), in some implementations, the computing system 108 can retrieve the data corresponding to the one or more common V&V products from the repository of common V&V products 110 prior to communicating with the digital engineering tools 102. In the example shown in FIGS. 2A-2B, the data requested at step 232 can correspond to "MIL HDBK 516c 5.5.2 (JSSG-2006)"—a regulatory standard that sets forth weight and center of gravity requirements for an aircraft to be certified as "airworthy." The repository of common V&V products 110 can receive the request for data corresponding to the one or more common V&V products (236) and transmit the corresponding data (238) to the computing system 108, which can, in turn, receive the data corresponding to the one or more common V&V products (e.g., regulatory and/or certification data) (240).

At step 242, the computing system 108 can process the updated CAD file and MB SE file (received at step 230) and the data corresponding to the one or more common V&V products (received at step 240) to identify and evaluate one or more requirements for certification. For example, the computing system can automatically process the CAD file and MBSE file to compute the weight and center of gravity for a physical manifestation of the digital prototype. The computing device can then compare these to the requirements for weight and center of gravity of aircraft identified within the data corresponding to "MIL HDBK 516c 5.5.2 (JSSG-2006)."

At step 244, based on the computing system's evaluation of the requirements identified within the data corresponding to "MIL HDBK 516c 5.5.2 (JSSG-2006)," the computing system 108 can generate and transmit a report to the user device 106A or API 106B. The report can summarize the results of the evaluation, including an indication of whether or not the identified requirements were satisfied. In some implementations, the report can also include one or more recommended actions for the user. The recommendations can be generated, for example, using the machine learning engine 120 as previously described above in relation to FIG. 1.

At step 246, the user device 106A or the API 106B can receive the report, and the user 104 can review the report.

For example, the report can be presented on a display of the user device 106A in order to be reviewed by the human user 104A and/or be received at the API 106B for processing by the artificial user 104B. In response to reviewing the report, the user 104 can operate the user device 106A or the API 106B to update the prototype design and/or transmit data representing one or more user instructions (248) to the computing system 108. As described previously, such user instructions can include instructions for the computing system 108 to re-evaluate an updated prototype design, use one or more different digital engineering tools 102 for the evaluation process, and/or modify the inputs to the digital engineering tools 102. At step 250, the computing system 108 can receive the one or more user instructions and perform one or more data manipulations in accordance with the one or more user instructions. In this way, the workflow 200 can enable the iterative design of a digital prototype using the interconnected digital engineering and certification ecosystem 100 to design and certify a product such as a UAV, drug, manufacturing process, etc. entirely within the digital world.

Figure 3:
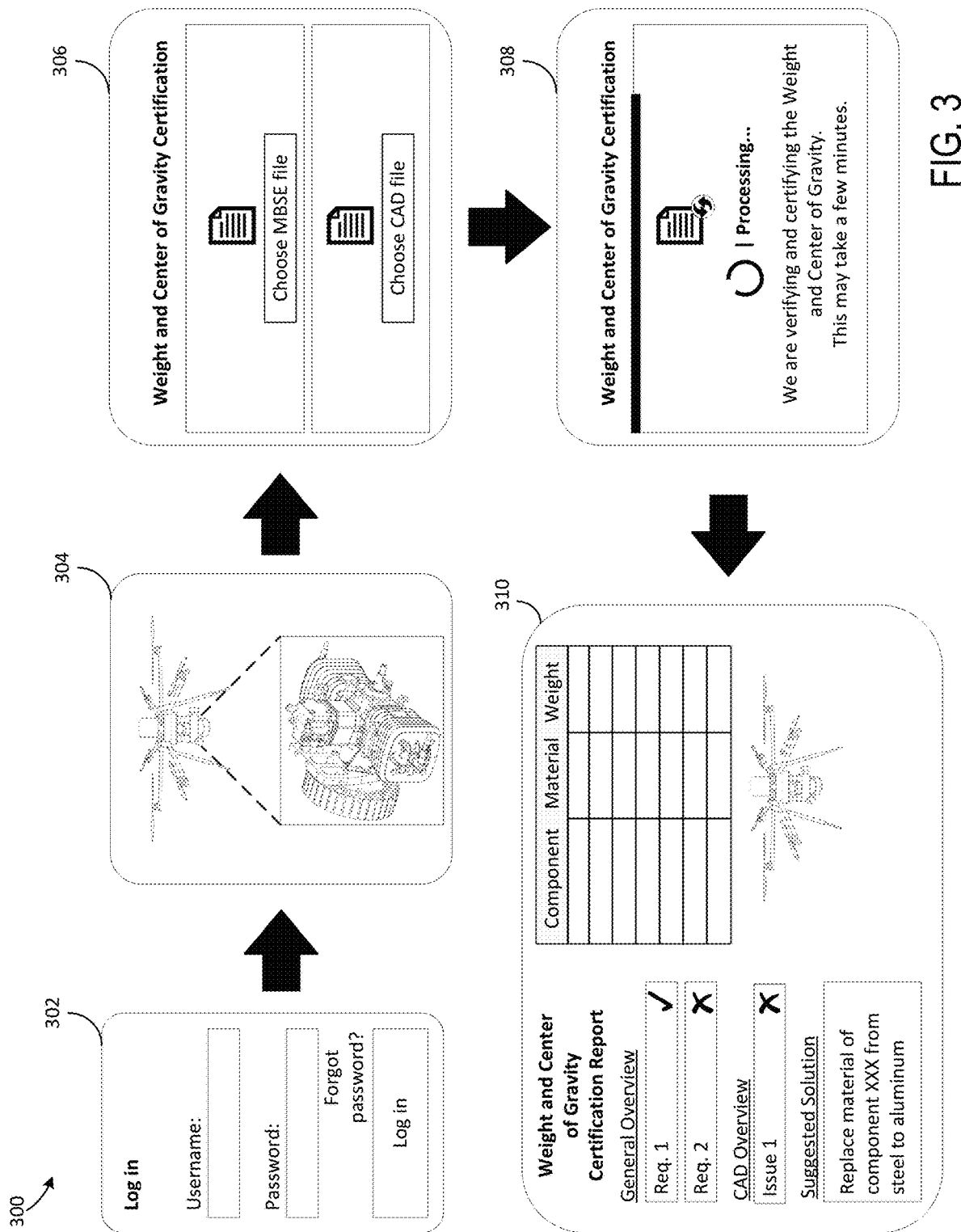
FIG. 3 shows a series of example displays shown on a user device corresponding to the example workflow of FIGS. 2A-2B.

Referring now to FIG. 3, a series of example displays 300 shown on the user device 106A is illustrated. It is noted that in implementations involving artificial users 104B that interface with the computing system via an API 106B, no displays are needed since artificial users 104B can directly process digital computer files received at the API 106B without further visualization. The series of example displays 300 can correspond to the example workflow 200 described in relation to FIGS. 2A-2B. Once again, these displays are not intended to be limiting, but are merely demonstrative of the kinds of user experiences that the user 104 (and in particular, a human user 104A) may encounter while using the interconnected digital engineering and certification ecosystem 100 for digital product development. The series of example displays 300, as described herein, highlights the ease of use of the ecosystem 100 and the avoided complexity of requiring a user to separately interface with individual digital engineering tools and manually review complex common V&V products to evaluate if a prototype of a product should be certified.

Display 302 shows a log-in screen that can be displayed on the user device 106A. The log-in screen can prompt the user 104 to input user credentials (e.g., username and password) to access the computing system 108 and the rest of the interconnected digital engineering and certification ecosystem 100. The user credentials associated with user 104 can serve a variety of functions. For example, as previously described, the user credentials can be associated with a skill level of the user, which can control what functionalities of the ecosystem 100 that the user 104 can access. In some implementations, the user credentials can additionally or alternatively be associated with an affiliation of the user (e.g., with a particular company and/or organizational entity), which can govern the previously designed products and/or solutions that a user may search for and/or be suggested by the computing system 108. In general, user credentials can help ensure that the user 104 is only able to access information within the ecosystem 100 that the user 104 is qualified and/or authorized to access.

Once the user 104 has logged in from the user device 106A, the user device 106A can be used to develop a digital prototype for a product. For example, display 304 shows a modeling screen that the user 104 might see while developing a digital model of a UAV (e.g., using a CAD tool). Once the prototype has been developed, the user can upload prototype data, such as a CAD file and/or a MBSE file to the computing system 108 (e.g., as in step 202 and step 204 of the workflow 200). Accordingly, display 306 shows a screen that can prompt the user 104 to upload the MBSE file and the CAD file to the computing system 108.

Once the user has uploaded the MBSE file and the CAD file to the computing system 108, the computing system 108 can perform a number of steps to evaluate the prototype with respect to one or more requirements identified in a common V&V product and to generate a report summarizing the evaluation (e.g., steps 206, 207, 210, 212, 214, 216, 230, 232, 240, 242, 244 of the workflow 200). In doing so, the computing system 108 may also communicate with the digital engineering tools 102 and repository of common V&V products 110, which can themselves perform operations to facilitate the evaluation of the prototype (e.g., steps 218, 220, 222, 224, 226, 228, 236, 238 of the workflow 200). These steps take time to complete (e.g., ranging from a few seconds to several hours), during which the display 308 can be shown on a screen of the user device 106A, providing information about the current status of the evaluation of the prototype.

Once the evaluation of the prototype is complete, a generated report can be transmitted to the user device 106A from the computing system 108 (e.g., at step 244 of the workflow 200). Display 310 shows a screen of the user device 106A that presents the report to the user 104. The report can present information indicating whether or not one or more requirements identified in the common V&V product of interest have been satisfied and can also present information about one or more issues that resulted in a failed requirement (e.g., a problematic component of the device). In some implementations, the presented information can also include more detailed data from the evaluation and/or a suggested solution for resolving the one or more issues to satisfy the requirements. The easily digestible format of the report presented on the display 310 can assist the user 104 with understanding the reasons why a prototype might fail one or more requirements and can provide the user 104 with actionable suggestions to improve the digital prototype. Even in implementations involving an artificial user 104B (where screen displays are not needed), a concise or standardized report in the form of a digital computer file sent to the API 106B can likewise assist the artificial user 104B with understanding the reasons why a prototype might fail one or more requirements and can provide the artificial user 104B with actionable suggestions to improve the digital prototype.

Figure 4:
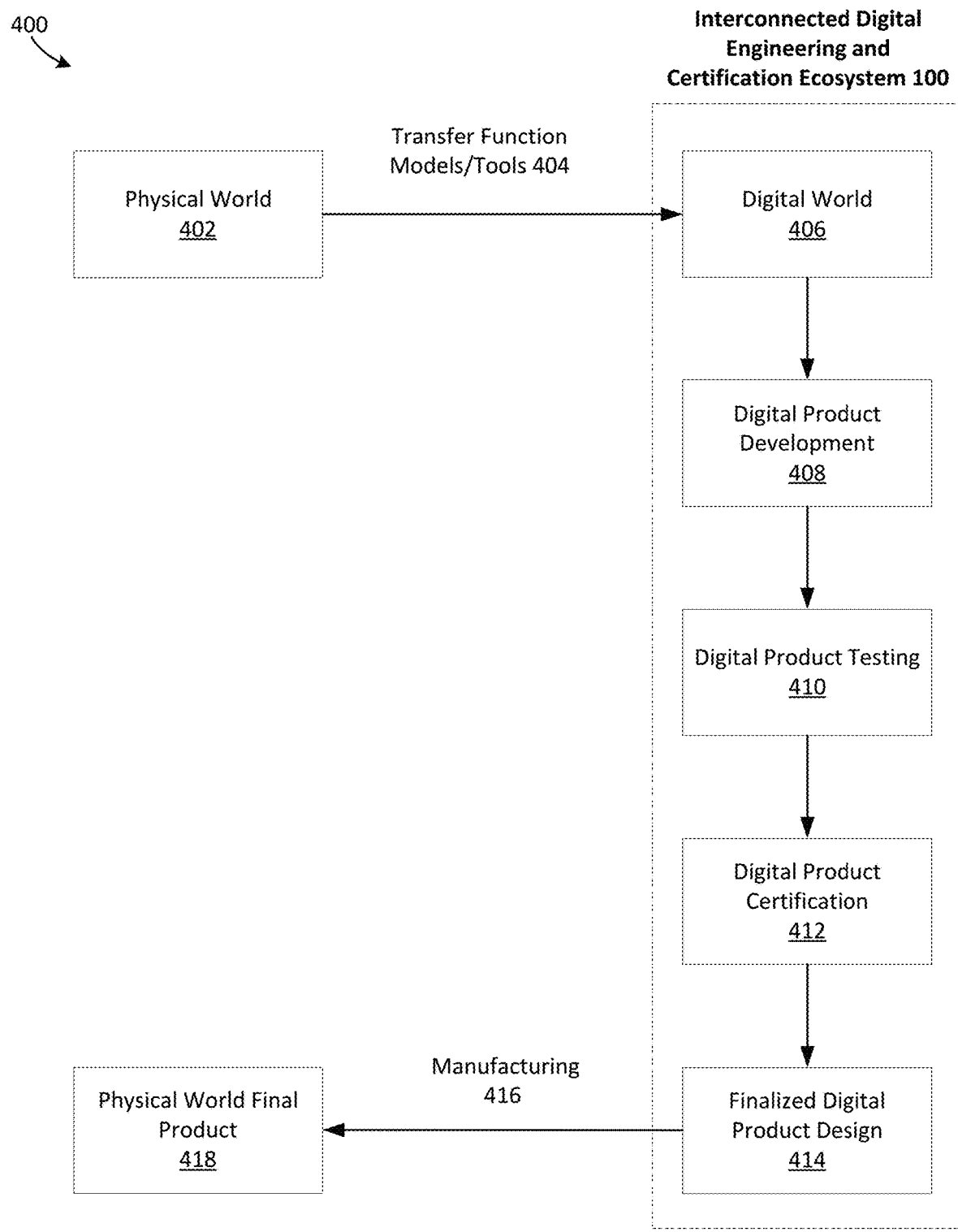
FIG. 4 is a flow chart showing an example product design process using an interconnected digital engineering and certification ecosystem.

Referring now to FIG. 4, a flow chart 400 is depicted, illustrating an example product design process using the interconnected digital engineering and certification ecosystem 100. By translating elements and characteristics such as laws of physics from the physical world 402 to a digital world 406, via transfer function models and tools 404, product development and certification can be enabled entirely (or nearly entirely or partially) within the ecosystem 100. It is noted that the entire physical world need not be perfectly replicated all at once, but in some cases, very specific subsets of the physical world can be described digitally by any number of models or simulations (e.g. a model describing turbulent flow of air between 200 and 600 knots, complemented by another model describing turbulent flow of air between 500 and 800 knots), which all together add up to a sufficient representation of the physical world so as to allow for certification of specific systems or products. An interconnected digital engineering and certification ecosystem (e.g., the ecosystem 100) can allow for each of these pieces to be added individually by many different people and many different entities without need for coordination and with aligned incentives (e.g., enabled by protection of intellectual property, monetization of models or valuable digital representations of the physical world, etc.), to allow the digital representation of the physical world to be built in a modular and complementary manner, allowing for each of the models or simulations to connect to one another and build off of one another. For example, digital product development 408, digital product testing 410, and digital product certification 412 can all occur within the ecosystem 100, taking place entirely within a digital realm or "metaverse" to produce a finalized digital product design 414. Following this product design process, the finalized digital product design need only be translated into the physical world (e.g., via manufacturing 416) to produce a physical world final product 418 at the very end of the product design process. This is in stark contrast to current product development and certification workflows, which may utilize digital engineering tools, but oftentimes still require the physical manufacturing, testing, and certification of prototypes throughout the iterative product development, product testing, and product certification process. Compared to such workflows, the product design process enabled by the interconnected digital engineering and certification ecosystem 100, can therefore yield significant savings of time, cost, materials, and environmental impact.

Figure 5:
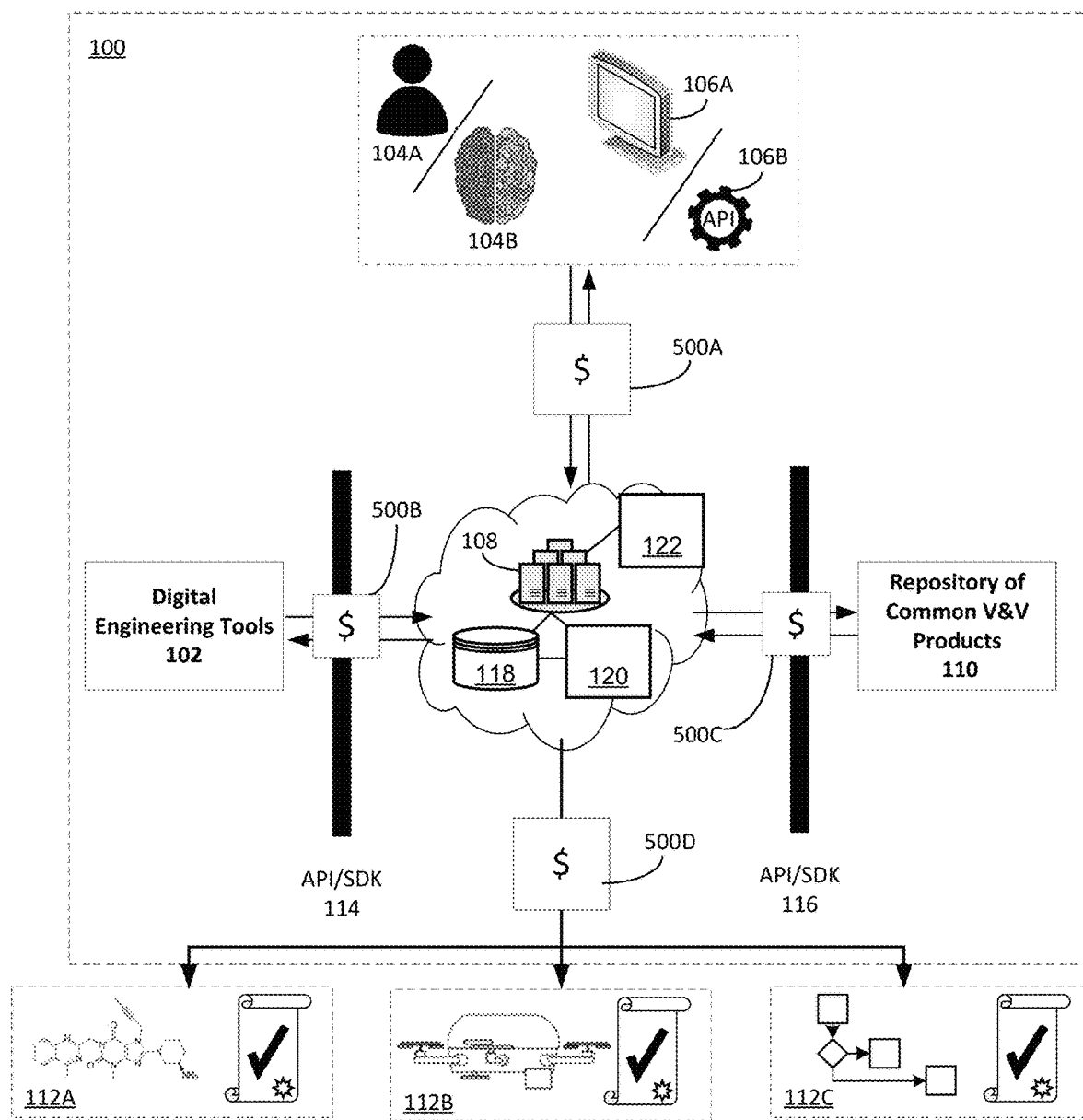
FIG. 5 is a diagram showing how an interconnected digital engineering and certification ecosystem can be monetized.

Referring to FIG. 5, the interconnected digital engineering and certification ecosystem 100 presents various different opportunities for monetization (shown as blocks 500A-500D). In some implementations, interactions between the user 104 and the computing system 108 can include an opportunity for monetization 500A. For example, the user 104 can be charged to send instructions to the computing system 108 and/or the user 104 can be charged to download data from the computing system 106 (e.g., certification reports). Charges can be subscription-based (e.g., charging a monthly or annual fee to use the computing system 108), can be usage-based (e.g., charging the user 104 based on a number of interactions with the computing system 108, an amount of time spent interacting with the computing system 108, etc.), or can be mixed (e.g., using a freemium model).

In some implementations, interactions between the computing system 108 and the digital engineering tools 102 can include an opportunity for monetization 500B. For example, the user 104 can be charged for sending data between the computing system 108 and/or the digital engineering tools 102. In some implementations, the charges paid by the user 104 can be split between third party providers of the digital engineering tools 102 and a party that operates the computing system 108. In some implementations, the third party providers of the digital engineering tools 102 may themselves pay a fee to the operator of the computing system 108 to have their digital engineering tools be included in the ecosystem 100. Charges to the user 104 can be subscription-based (e.g., charging a monthly or annual fee to gain access to particular digital engineering tools 102), can be usage-based (e.g., charging the user 104 based on an amount of data transferred between the digital engineering tools 102 and the computing system 108, an amount of processing time required by the digital engineering tools 102, etc.), or can be mixed (e.g., using a freemium model).

In some implementations, interactions between the computing system 108 and the repository of common V&V products 110 can include an opportunity for monetization 500C. For example, the user 104 can be charged for sending data between the computing system 108 and/or the repository of common V&V products 110. In some implementations, the charges paid by the user 104 can be split between the authorities operating the repository of common V&V products 110 and a party that operates the computing system 108. Charges to the user 104 can be subscription-based (e.g., charging a monthly or annual fee to gain access to the repository of common V&V products 110), can be usage-based (e.g., charging the user 104 based on an amount of data transferred between the repository of common V&V products 110 and the computing system 108, a number of common V&V products requested, etc.), or can be mixed (e.g., using a freemium model).

In some implementations, the ultimate certification of the digitally certified products 112 by the computing system 108 can also include an opportunity for monetization 500D. For example, the user 104 can be charged a fee to perform a formal certification of the user's product. In addition or alternatively, the user 104 can be charged a fee to download a proof of certification.

Figure 6:
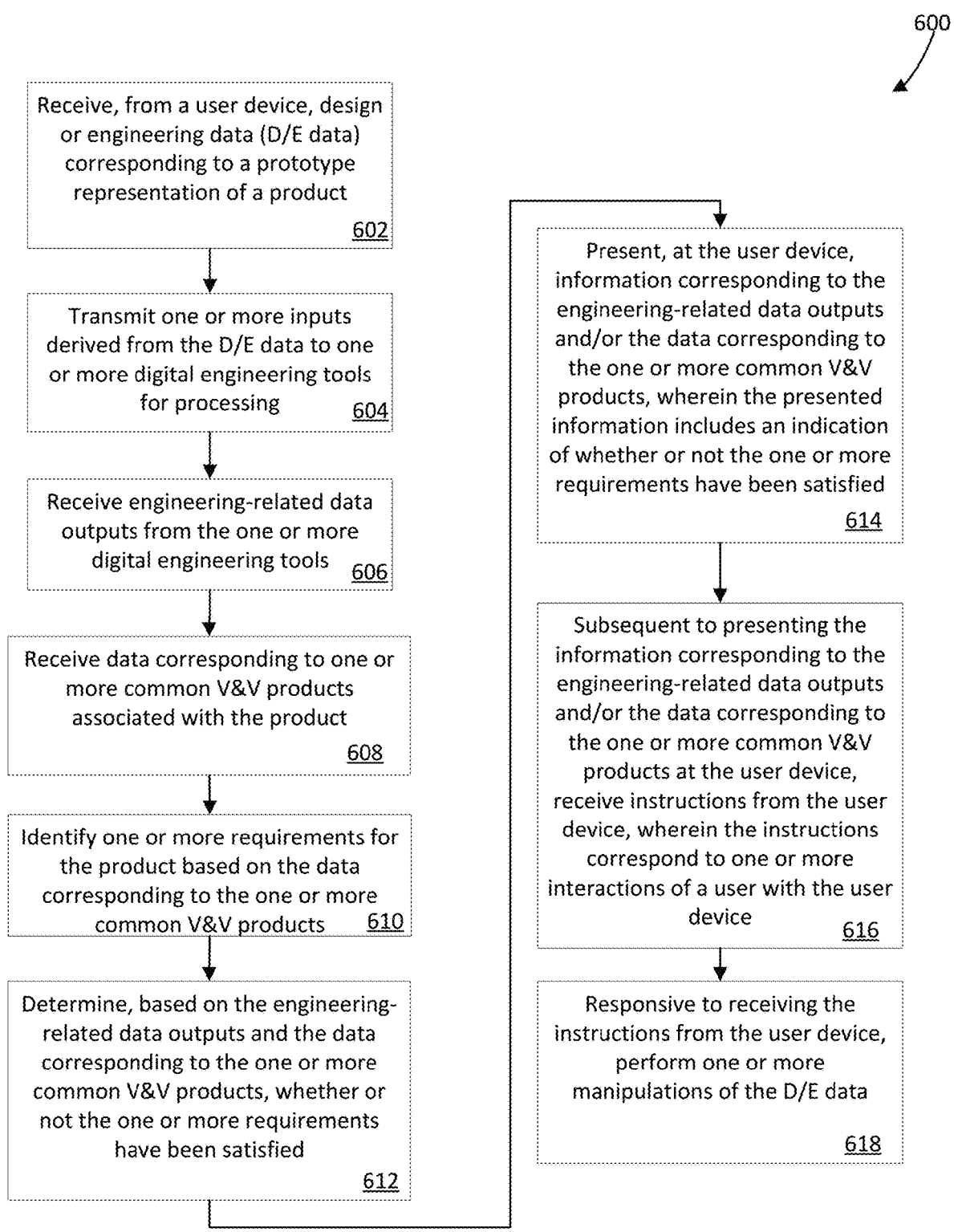
FIG. 6 is a flow chart showing a process for product development performed by a computing system of an interconnected digital engineering and certification ecosystem.

FIG. 6 illustrates an example process 600 for product development. In some implementations, the process 600 can be executed by a computing system (e.g., computing system 108) of an interconnected digital engineering and certification ecosystem (e.g., the ecosystem 100).

Operations of the process 600 include receiving, from a user device, design and/or engineering data (D/E data) corresponding to a prototype representation of a product (602). For example, the user device can correspond to the user device 106A or the API 106B, and the D/E data can correspond to a MBSE file, a CAD file, and/or other digital files or information associated with a digital prototype, as described above. In some implementations, the product can be a UAV or another type of aircraft; a car; a boat; an underwater vehicle; an industrial robotic; a spacecraft; a satellite; a structure; a tool; a physical device; a mobile device; a drug, chemical product, or biologic; a manufacturing process; or any other complex system (either physical or non-physical) that may be assessed against a common V&V product.

Operations of the process 600 also include transmitting one or more inputs derived from the D/E data to one or more digital engineering tools for processing (604). For example, the one or more digital engineering tools can correspond to the digital engineering tools 102 described above. In some implementations, at least a subset of the one or more digital engineering tools can include model-based systems engineering (MBSE) tools, augmented reality (AR) tools, computer aided design (CAD) tools, data analytics tools, modeling and simulation (M&S) tools, product lifecycle management (PLM) tools, simulation engines, requirements models, electronics models, test-plan models, cost-models, schedule models, software modeling, supply-chain models, manufacturing models, cyber security models, multi-attribute trade-space tools, or mission effects models or other similar digital engineering tools that may be recognized as engineering design tools by a person of ordinary skill in the relevant field.

Operations of the process 600 also include receiving engineering-related data outputs from the one or more digital engineering tools (606). For example, the engineering-related data outputs can correspond to the results of models, tests, and/or simulations performed by the data engineering tools 102, as described above.

Operations of the process 600 also include receiving data corresponding to one or more common V&V products associated with the product (608). For example, the one or more common V&V products can be digitized regulatory and/or certification standards and can correspond to the common V&V products 110A-110J stored in the repository of common V&V products 110 described above. In some implementations, the data corresponding to the one or more common V&V products can be received from the user device (e.g., via a user upload). In some implementations, the data corresponding to the one or more common V&V products can be received from a regulatory and/or certification authority (e.g., via a repository of common V&V products hosted or maintained by the regulatory and/or certification authority).

Operations of the process 600 also include identifying one or more requirements for the product based on the data corresponding to the one or more common V&V products (610). For example, the one or more requirements can correspond to requirements that must be satisfied in order to certify a product in accordance with a particular common V&V product.

Operations of the process 600 also include determining, based on the engineering-related data outputs and the data corresponding to the one or more common V&V products, whether or not the one or more requirements have been satisfied (612). In some implementations, rather than making a binary determination, the operations of the process 600 can include determining whether or not the one or more requirements are likely to satisfied by the prototype representation of the product (e.g., based on an estimated probability). In some implementations, determining whether or not the one or more requirements have been satisfied (or are likely to be satisfied) based on the engineering-related data outputs can include determining, with or without any human input, whether or not the one or more requirements have been satisfied.

Operations of the process 600 also include presenting, at the user device, information corresponding to the engineering-related data outputs and/or the data corresponding to the one or more common V&V products, wherein the presented information includes an indication of whether or not the one or more requirements have been satisfied (614). In some implementations, the presented information can include an indication of a probability of whether or not the one or more requirements would be satisfied by the prototype representation of the product. For example, the information can be presented at the user device in the form of a report, as shown in the display 310 of FIG. 3 and as previously described above. In some implementations, the presented information can further include a recommended action that the user of the user device can take to satisfy the one or more requirements. In such implementations, the recommended action can include a suggestion to use a particular digital engineering tool of the one or more digital engineering tools, a suggestion to modify the one or more inputs transmitted to the one or more digital engineering tools, a suggestion to modify one or more components of the prototype representation of the product, a suggestion to replace one or more components of the prototype representation of the product with a previously designed solution, and/or a suggestion of a wholly or partially new design generated by the system (e.g., using the machine learning engine 120).

Operations of the process also include subsequent to presenting the information corresponding to the engineering-related data outputs and/or the data corresponding to the one or more common V&V products at the user device, receiving instructions from the user device, wherein the instructions correspond to one or more interactions of a user with the user device (616).

Operations of the process also include being responsive to receiving the instructions from the user device, performing one or more manipulations of the D/E data (618). In some implementations, performing the one or more manipulations of the D/E data can include modifying the D/E data and/or deriving modified inputs from the D/E data for transmission to the one or more digital engineering tools.

Additional operations of the process 600 can include the following. In some implementations, the process 600 can include storing, on a storage device, usage data representing the received data corresponding to the one or more common V&V products, the received D/E data, the engineering-related data outputs from the one or more digital engineering tools, the indication of whether or not the one or more requirements have been satisfied (or are likely to be satisfied), the one or more interactions of the user with the user device, and/or the one or more manipulations of the D/E data. The process 600 can also include incorporating applications and services (e.g., the applications and services 122) that automate or partially automate determinations of whether the one or more requirements have been satisfied or partially satisfied. The process 600 can also include incorporating at least a portion of the usage data in a training dataset, and training a machine learning model based on the training dataset. In some implementations, the machine learning model can be configured to: receive, as input, information relating to another product being designed by another user, and output a suggestion for the another user to use a particular digital engineering tool of the one or more digital engineering tools, a suggestion to modify one or more inputs transmitted to the one or more digital engineering tools by the another user, a suggestion to modify one or more components of another prototype representation associated with the another user, and/or a suggestion to replace one or more components of the another prototype representation with a previously designed solution. In some implementations, the process 600 can also include using the stored usage data for one or more sensitivity analyses. In some implementations, the process 600 can also include using the stored usage data to improve the performance of applications and services (e.g., the applications and services 122).

In some implementations, additional operations of the process 600 can include checking one or more credentials of the user prior to performing the one or more manipulations of the D/E data, and determining, based on the one or more credentials, that the user is qualified or authorized to perform the one or more manipulations of the D/E data.

Figure 7:
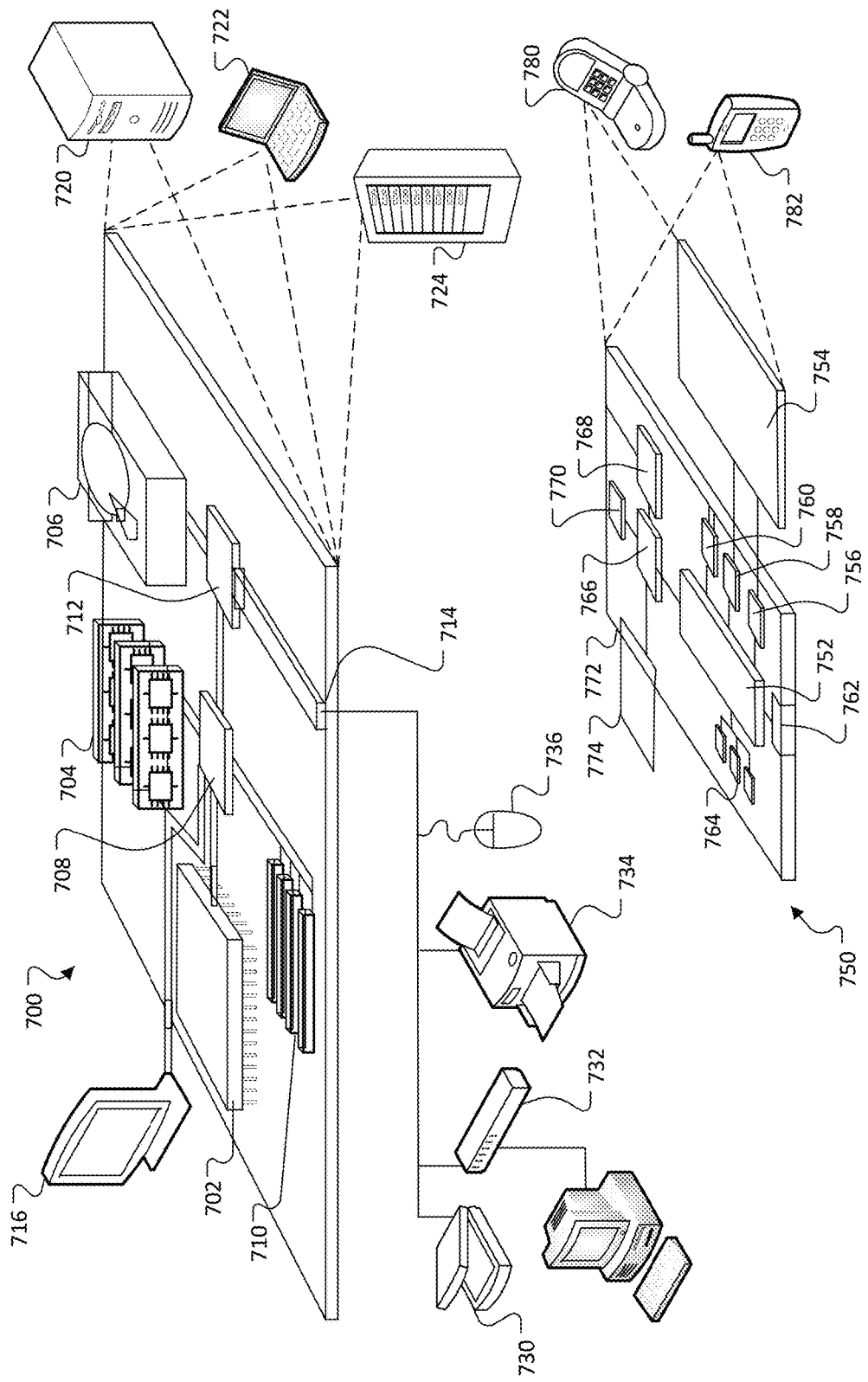
FIG. 7 is a diagram illustrating an example of a computing environment.

FIG. 7 shows an example of a computing device 700 and a mobile computing device 750 that are employed to execute implementations of the present disclosure. The computing device 700 is intended to represent various forms of digital computers, such as laptops, desktops, workstations, personal digital assistants, servers, blade servers, mainframes, and other appropriate computers. The mobile computing device 750 is intended to represent various forms of mobile devices, such as personal digital assistants, cellular telephones, smart-phones, AR devices, and other similar computing devices. The components shown here, their connections and relationships, and their functions, are meant to be examples only, and are not meant to be limiting. The computing device 700 and/or the mobile computing device 750 can form at least a portion of the user device 106A or API 106B and the computing system 108 described above. As described previously, in some implementations, the computing system 108 can be a distributed computing system that includes multiple computing devices such as the computing device 700 and/or the mobile computing device 750. In other implementations the computing system 108 can comprises a single computing device. In some implementations, the API 106B can be implemented on the computing device 700 and/or the mobile computing device 750 to relay a digital computer file to a non-human, artificial user 104B (e.g., an artificial intelligence and/or an algorithmic user), which may itself be implemented on the computing device 700 and/or the mobile computing device 750 (or on a separate instance of the computing device 700 and/or the mobile computing device 750).

The computing device 700 includes a processor 702, a memory 704, a storage device 707, a high-speed interface 708, and a low-speed interface 712. In some implementations, the high-speed interface 708 connects to the memory 704 and multiple high-speed expansion ports 710. In some implementations, the low-speed interface 712 connects to a low-speed expansion port 714 and the storage device 706. Each of the processor 702, the memory 704, the storage device 706, the high-speed interface 708, the high-speed expansion ports 710, and the low-speed interface 712, are interconnected using various buses, and may be mounted on a common motherboard or in other manners as appropriate. The processor 702 can process instructions for execution within the computing device 700, including instructions stored in the memory 704 and/or on the storage device 706 to display graphical information for a graphical user interface (GUI) on an external input/output device, such as a display 716 coupled to the high-speed interface 708. In other implementations, multiple processors and/or multiple buses may be used, as appropriate, along with multiple memories and types of memory. In addition, multiple computing devices may be connected, with each device providing portions of the necessary operations (e.g., as a server bank, a group of blade servers, or a multi-processor system).

The memory 704 stores information within the computing device 700. In some implementations, the memory 704 is a volatile memory unit or units. In some implementations, the memory 704 is a non-volatile memory unit or units. The memory 704 may also be another form of a computer-readable medium, such as a magnetic or optical disk.

The storage device 706 is capable of providing mass storage for the computing device 700. In some implementations, the storage device 706 may be or include a computer-readable medium, such as a floppy disk device, a hard disk device, an optical disk device, a tape device, a flash memory, or other similar solid-state memory device, or an array of devices, including devices in a storage area network or other configurations. Instructions can be stored in an information carrier. The instructions, when executed by one or more processing devices, such as processor 702, perform one or more methods, such as those described above. The instructions can also be stored by one or more storage devices, such as computer-readable or machine-readable mediums, such as the memory 704, the storage device 706, or memory on the processor 702.

The high-speed interface 708 manages bandwidth-intensive operations for the computing device 700, while the low-speed interface 712 manages lower bandwidth-intensive operations. Such allocation of functions is an example only. In some implementations, the high-speed interface 708 is coupled to the memory 704, the display 716 (e.g., through a graphics processor or accelerator), and to the high-speed expansion ports 710, which may accept various expansion cards. In the implementation, the low-speed interface 712 is coupled to the storage device 706 and the low-speed expansion port 714. The low-speed expansion port 714, which may include various communication ports (e.g., Universal Serial Bus (USB), Bluetooth, Ethernet, wireless Ethernet) may be coupled to one or more input/output devices. Such input/output devices may include a scanner 730, a printing device 734, or a keyboard or mouse 736. The input/output devices may also be coupled to the low-speed expansion port 714 through a network adapter 732. Such network input/output devices may include, for example, a switch or router.

The computing device 700 may be implemented in a number of different forms, as shown in FIG. 7. For example, it may be implemented as a standard server 720, or multiple times in a group of such servers. In addition, it may be implemented in a personal computer such as a laptop computer 722. It may also be implemented as part of a rack server system 724, high performance computing enclave, or quantum and/or non-silicon based computing system. Alternatively, components from the computing device 700 may be combined with other components in a mobile device, such as a mobile computing device 750. Each of such devices may contain one or more of the computing device 700 and the mobile computing device 750, and an entire system may be made up of multiple computing devices communicating with each other.

The mobile computing device 750 includes a processor 752; a memory 764; an input/output device, such as a display 754; a communication interface 766; and a transceiver 768; among other components. The mobile computing device 750 may also be provided with a storage device, such as a micro-drive or other device, to provide additional storage. Each of the processor 752, the memory 764, the display 754, the communication interface 766, and the transceiver 768, are interconnected using various buses, and several of the components may be mounted on a common motherboard or in other manners as appropriate. In some implementations, the mobile computing device 750 may include a camera device(s).

The processor 752 can execute instructions within the mobile computing device 750, including instructions stored in the memory 764. The processor 752 may be implemented as a chipset of chips that include separate and multiple analog and digital processors. For example, the processor 752 may be a Complex Instruction Set Computers (CISC) processor, a Reduced Instruction Set Computer (RISC) processor, or a Minimal Instruction Set Computer (MISC) processor. The processor 752 may provide, for example, for coordination of the other components of the mobile computing device 750, such as control of user interfaces (UIs), applications run by the mobile computing device 750, and/or wireless communication by the mobile computing device 750.

The processor 752 may communicate with a user through a control interface 758 and a display interface 756 coupled to the display 754. The display 754 may be, for example, a Thin-Film-Transistor Liquid Crystal Display (TFT) display, an Organic Light Emitting Diode (OLED) display, or other appropriate display technology. The display interface 756 may include appropriate circuitry for driving the display 754 to present graphical and other information to a user. The control interface 758 may receive commands from a user and convert them for submission to the processor 752. In addition, an external interface 762 may provide communication with the processor 752, so as to enable near area communication of the mobile computing device 750 with other devices. The external interface 762 may provide, for example, for wired communication in some implementations, or for wireless communication in other implementations, and multiple interfaces may also be used.

The memory 764 stores information within the mobile computing device 750. The memory 764 can be implemented as one or more of a computer-readable medium or media, a volatile memory unit or units, or a non-volatile memory unit or units. An expansion memory 774 may also be provided and connected to the mobile computing device 750 through an expansion interface 772, which may include, for example, a Single in Line Memory Module (SIMM) card interface. The expansion memory 774 may provide extra storage space for the mobile computing device 750, or may also store applications or other information for the mobile computing device 750. Specifically, the expansion memory 774 may include instructions to carry out or supplement the processes described above, and may include secure information also. Thus, for example, the expansion memory 774 may be provided as a security module for the mobile computing device 750, and may be programmed with instructions that permit secure use of the mobile computing device 750. In addition, secure applications may be provided via the SIMM cards, along with additional information, such as placing identifying information on the SIMM card in a non-hackable manner.

The memory may include, for example, flash memory and/or non-volatile random access memory (NVRAM), as discussed below. In some implementations, instructions are stored in an information carrier. The instructions, when executed by one or more processing devices, such as processor 752, perform one or more methods, such as those described above. The instructions can also be stored by one or more storage devices, such as one or more computer-readable or machine-readable mediums, such as the memory 764, the expansion memory 774, or memory on the processor 752. In some implementations, the instructions can be received in a propagated signal, such as, over the transceiver 768 or the external interface 762.

The mobile computing device 750 may communicate wirelessly through the communication interface 766, which may include digital signal processing circuitry where necessary. The communication interface 766 may provide for communications under various modes or protocols, such as Global System for Mobile communications (GSM) voice calls, Short Message Service (SMS), Enhanced Messaging Service (EMS), Multimedia Messaging Service (MMS) messaging, code division multiple access (CDMA), time division multiple access (TDMA), Personal Digital Cellular (PDC), Wideband Code Division Multiple Access (WCDMA), CDMA2000, General Packet Radio Service (GPRS). Such communication may occur, for example, through the transceiver 768 using a radio frequency. In addition, short-range communication, such as using Bluetooth or Wi-Fi, may occur. In addition, a Global Positioning System (GPS) receiver module 770 may provide additional navigation- and location-related wireless data to the mobile computing device 750, which may be used as appropriate by applications running on the mobile computing device 750.

The mobile computing device 750 may also communicate audibly using an audio codec 760, which may receive spoken information from a user and convert it to usable digital information. The audio codec 760 may likewise generate audible sound for a user, such as through a speaker, e.g., in a handset of the mobile computing device 750. Such sound may include sound from voice telephone calls, may include recorded sound (e.g., voice messages, music files, etc.) and may also include sound generated by applications operating on the mobile computing device 750.

The mobile computing device 750 may be implemented in a number of different forms, as shown in FIG. 7. For example, it may be implemented as a phone device 780, a personal digital assistant 782, and a tablet device (not shown). The mobile computing device 750 may also be implemented as a component of a smart-phone, AR device, or other similar mobile device.

Computing device 700 and/or 750 can also include USB flash drives. The USB flash drives may store operating systems and other applications. The USB flash drives can include input/output components, such as a wireless transmitter or USB connector that may be inserted into a USB port of another computing device.

Other embodiments and applications not specifically described herein are also within the scope of the following claims. Elements of different implementations described herein may be combined to form other embodiments.

What is claimed is:

1. A computing system-implemented method comprising:
    receiving, at a computing system, design and/or engineering data (D/E data) corresponding to a prototype representation of a product;
    transmitting, via an application programming interface (API) or software development kit (SDK), one or more inputs derived from the D/E data to two or more digital engineering tools for processing,
    wherein the two or more digital engineering tools are provided by at least two distinct digital engineering tool providers,
    wherein a first portion of the two or more digital engineering tools provided by a first provider of the at least two distinct digital engineering tool providers is not directly interoperable with a second portion of the two or more digital engineering tools provided by a second provider of the at least two distinct digital engineering tool providers, and
    wherein the API or SDK is configured to interface with each of the two or more digital engineering tools to automatically enable interoperable use of multiple digital engineering tools in parallel;
    receiving engineering-related data outputs from the two or more digital engineering tools;
    receiving, at the computing system, data corresponding to one or more common validation and verification (V&V) products associated with the product; and
    determining, based on the engineering-related data outputs and the data corresponding to the one or more common V&V products, whether or not one or more requirements for the product have been satisfied.

2. The computing system-implemented method of claim 1, comprising identifying the one or more requirements for the product based on the data corresponding to the one or more common V&V products.

3. The computing system-implemented method of claim 1, comprising presenting, at the computing system, information corresponding to the engineering-related data outputs and/or the data corresponding to the one or more common V&V products.

4. The computing system-implemented method of claim 3, wherein the presented information comprises an indication of whether or not the one or more requirements have been satisfied, or an indication of a probability of whether or not the one or more requirements would be satisfied by the prototype representation of the product.

5. The computing system-implemented method of claim 1, wherein the computing system comprises a personal computer or a laptop computer.

6. The computing system-implemented method of claim 1, wherein the computing system comprises a mobile device.

7. The computing system-implemented method of claim 6, wherein the mobile device is one of a personal digital assistant, a cellular telephone, a smart phone, and an augmented reality device.

8. The computing system-implemented method of claim 1, wherein the computing system is unattached to one or more external networks.

9. The computing system-implemented method of claim 1, wherein the product is at least one of an aircraft, an automobile, a drug, or a medical device.

10. The computing system-implemented method of claim 1, wherein at least a subset of the two or more digital engineering tools comprises model-based systems engineering (MBSE) tools, augmented reality (AR) tools, computer aided design (CAD) tools, data analytics tools, modeling and simulation (M&S) tools, product lifecycle management (PLM) tools, simulation engines, requirements models, electronics models, test-plan models, cost-models, schedule models, software modeling, supply-chain models, manufacturing models, cyber security models, multi-attribute tradespace tools, or mission effects models.

11. The computing system-implemented method of claim 1, wherein the one or more V&V products comprise a regulatory standard related to development and/or certification of an aircraft, a medical standard, a medical certification regulation, a manufacturing standard, and/or a manufacturing certification regulation.

12. The computing system-implemented method of claim 1, comprising storing, on a storage device, usage data representing the received data corresponding to the one or more V&V products, the received D/E data, the engineering-related data outputs from the two or more digital engineering tools, an indication of whether or not the one or more requirements have been satisfied, an indication of a probability of whether or not the one or more requirements would be satisfied by the prototype representation of the product, one or more interactions of a user with a user device, and/or one or more manipulations of the D/E data.

13. A computing system comprising:
    a memory to store instructions that are executable; and
    one or more processing devices in communication with the memory, the one or more processing devices configured to execute the instructions to perform operations comprising:
    receiving, at the computing system, design and/or engineering data (D/E data) corresponding to a prototype representation of a product;
    transmitting, via an application programming interface (API) or software development kit (SDK), one or more inputs derived from the D/E data to two or more digital engineering tools for processing,
    wherein the two or more digital engineering tools are provided by at least two distinct digital engineering tool providers,
    wherein a first portion of the two or more digital engineering tools provided by a first provider of the at least two distinct digital engineering tool providers is not directly interoperable with a second portion of the two or more digital engineering tools provided by a second provider of the at least two distinct digital engineering tool providers, and
    wherein the API or SDK is configured to interface with each of the two or more digital engineering tools to automatically enable interoperable use of multiple digital engineering tools in parallel;
    receiving engineering-related data outputs from the two or more digital engineering tools;

receiving, at the computing system, data corresponding to one or more common validation and verification (V&V) products associated with the product; and determining, based on the engineering-related data outputs and the data corresponding to the one or more common V&V products, whether or not one or more requirements for the product have been satisfied.

14. The computing system of claim 13, wherein the operations comprise identifying the one or more requirements for the product based on the data corresponding to the one or more common V&V products.

15. The computing system of claim 13, wherein the operations comprise presenting, at the computing system, information corresponding to the engineering-related data outputs and/or the data corresponding to the one or more common V&V products.

16. The computing system of claim 15, wherein the presented information comprises an indication of whether or not the one or more requirements have been satisfied, or an indication of a probability of whether or not the one or more requirements would be satisfied by the prototype representation of the product.

17. The computing system of claim 13, wherein the computing system comprises a personal computer or a laptop computer.

18. The computing system of claim 13, wherein the computing system comprises a mobile device.

19. The computing system of claim 18, wherein the mobile device is one of a personal digital assistant, a cellular telephone, a smart phone, and an augmented reality device.

20. The computing system of claim 13, wherein the computing system is unattached to one or more external networks.

21. The computing system of claim 13, wherein the product is at least one of an aircraft, an automobile, a drug, or a medical device.

22. The computing system of claim 13, wherein at least a subset of the two or more digital engineering tools comprises model-based systems engineering (MBSE) tools, augmented reality (AR) tools, computer aided design (CAD) tools, data analytics tools, modeling and simulation (M&S) tools, product lifecycle management (PLM) tools, simulation engines, requirements models, electronics models, test-plan models, cost-models, schedule models, software modeling, supply-chain models, manufacturing models, cyber security models, multi-attribute trade-space tools, or mission effects models.

23. The computing system of claim 13, wherein the one or more V&V products comprise a regulatory standard related to development and/or certification of an aircraft, a medical standard, a medical certification regulation, a manufacturing standard, and/or a manufacturing certification regulation.

24. The computing system of claim 13, wherein the operations comprise storing, on a storage device, usage data representing the received data corresponding to the one or more V&V products, the received D/E data, the engineering-related data outputs from the two or more digital engineering tools, an indication of whether or not the one or more requirements have been satisfied, an indication of a probability of whether or not the one or more requirements would be satisfied by the prototype representation of the product, one or more interactions of a user with a user device, and/or one or more manipulations of the D/E data.

25. One or more non-transitory machine-readable storage media storing instructions that are executable by one or more processing devices, and upon such execution cause the one or more processing devices to perform operations comprising:

receiving, at a computing system, design and/or engineering data (D/E data) corresponding to a prototype representation of a product;

transmitting, via an application programming interface (API) or software development kit (SDK), one or more inputs derived from the D/E data to two or more digital engineering tools for processing, wherein the two or more digital engineering tools are provided by at least two distinct digital engineering tool providers, wherein a first portion of the two or more digital engineering tools provided by a first provider of the at least two distinct digital engineering tool providers is not directly interoperable with a second portion of the two or more digital engineering tools provided by a second provider of the at least two distinct digital engineering tool providers, and wherein the API or SDK is configured to interface with each of the two or more digital engineering tools to automatically enable interoperable use of multiple digital engineering tools in parallel;

receiving engineering-related data outputs from the two or more digital engineering tools;

receiving, at the computing system, data corresponding to one or more common validation and verification (V&V) products associated with the product; and determining, based on the engineering-related data outputs and the data corresponding to the one or more common V&V products, whether or not one or more requirements for the product have been satisfied.

26. The one or more non-transitory machine-readable storage media of claim 25, wherein the operations comprise identifying the one or more requirements for the product based on the data corresponding to the one or more common V&V products.

27. The one or more non-transitory machine-readable storage media of claim 25, wherein the operations comprise presenting, at the computing system, information corresponding to the engineering-related data outputs and/or the data corresponding to the one or more common V&V products.

28. The one or more non-transitory machine-readable storage media of claim 27, wherein the presented information comprises an indication of whether or not the one or more requirements have been satisfied, or an indication of a probability of whether or not the one or more requirements would be satisfied by the prototype representation of the product.

29. The one or more non-transitory machine-readable storage media of claim 25, wherein the computing system comprises a personal computer or a laptop computer.

30. The one or more non-transitory machine-readable storage media of claim 25, wherein the computing system comprises a mobile device.

31. The one or more non-transitory machine-readable storage media of claim 25, wherein the computing system is unattached to one or more external networks.

32. The one or more non-transitory machine-readable storage media of claim 25, wherein the product is at least one of an aircraft, an automobile, a drug, or a medical device.

33. The one or more non-transitory machine-readable storage media of claim 25, wherein at least a subset of the two or more digital engineering tools comprises model-based systems engineering (MBSE) tools, augmented reality (AR) tools, computer aided design (CAD) tools, data analytics tools, modeling and simulation (M&S) tools, product lifecycle management (PLM) tools, simulation engines, requirements models, electronics models, test-plan models, cost-models, schedule models, software modeling, supply-chain models, manufacturing models, cyber security models, multi-attribute trade-space tools, or mission effects models.

34. The one or more non-transitory machine-readable storage media of claim 25, wherein the one or more V&V products comprise a regulatory standard related to development and/or certification of an aircraft, a medical standard, a medical certification regulation, a manufacturing standard, and/or a manufacturing certification regulation.

35. The one or more non-transitory machine-readable storage media of claim 25, wherein the operations comprise storing, on a storage device, usage data representing the received data corresponding to the one or more V&V products, the received D/E data, the engineering-related data outputs from the two or more digital engineering tools, an indication of whether or not the one or more requirements have been satisfied, an indication of a probability of whether or not the one or more requirements would be satisfied by the prototype representation of the product, one or more interactions of a user with a user device, and/or one or more manipulations of the D/E data.

\* \* \* \* \*